United States Patent
Jang et al.

(10) Patent No.: US 12,125,831 B2
(45) Date of Patent: Oct. 22, 2024

(54) LIGHT EMITTING DEVICE FOR DISPLAY AND LIGHT EMITTING PACKAGE HAVING THE SAME

(71) Applicant: SEOUL VIOSYS CO., LTD., Ansan-si (KR)

(72) Inventors: Jong Min Jang, Ansan-si (KR); Chang Yeon Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 18/231,764

(22) Filed: Aug. 8, 2023

(65) Prior Publication Data
US 2023/0387087 A1 Nov. 30, 2023

Related U.S. Application Data

(63) Continuation of application No. 17/873,040, filed on Jul. 25, 2022, now Pat. No. 11,769,761, which is a
(Continued)

(51) Int. Cl.
*H01L 33/56* (2010.01)
*H01L 23/00* (2006.01)
(Continued)

(52) U.S. Cl.
CPC .......... *H01L 25/0756* (2013.01); *H01L 24/32* (2013.01); *H01L 24/33* (2013.01);
(Continued)

(58) Field of Classification Search
CPC ..... H01L 25/0756; H01L 24/32; H01L 24/33; H01L 25/0753; H01L 33/62;
(Continued)

(56) References Cited

U.S. PATENT DOCUMENTS 11,527,519 B2   12/2022   Chae et al.
2003/0047742 A1  3/2003   Hen
(Continued)

FOREIGN PATENT DOCUMENTS

JP    2002-16312 A    1/2002
JP    2006-216933 A   8/2006
(Continued)

OTHER PUBLICATIONS

International Search Report dated Jan. 4, 2021, issued in International Patent Application No. PCT/KR2020/012452 (with English Translation).
(Continued)

*Primary Examiner* — Elias Ullah
(74) *Attorney, Agent, or Firm* — Oblon, McClelland, Maier & Neustadt, L.L.P.

(57) ABSTRACT

A light emitting device for a display including: a base layer; a first LED sub-unit, a second LED sub-unit, and a third LED sub-unit on the base layer; and a supporting layer covering the first LED sub-unit, the second LED sub-unit, and the third LED sub-unit, in which the third LED sub-unit is configured to emit light having a shorter wavelength than that of light emitted from the first LED sub-unit, and a luminous intensity ratio of light emitted from the third LED sub-unit and the second LED sub-unit is configured to be about 6:1.

20 Claims, 23 Drawing Sheets

Related U.S. Application Data continuation of application No. 17/020,834, filed on Sep. 15, 2020, now Pat. No. 11,398,462.

(60) Provisional application No. 62/902,069, filed on Sep. 18, 2019.

(51) Int. Cl.
 *H01L 25/075* (2006.01)
 *H01L 33/62* (2010.01)
 *H01L 33/00* (2010.01)

(52) U.S. Cl.
 CPC .......... *H01L 25/0753* (2013.01); *H01L 33/62* (2013.01); *H01L 33/0095* (2013.01); *H01L 33/56* (2013.01); *H01L 2224/32145* (2013.01); *H01L 2224/33181* (2013.01); *H01L 2924/12041* (2013.01)

(58) Field of Classification Search
 CPC ................. H01L 33/0095; H01L 33/56; H01L 2224/32145; H01L 2224/33181; H01L 2924/12041; H01L 2924/181; H01L 24/95; H01L 27/153
 See application file for complete search history.

(56) References Cited

U.S. PATENT DOCUMENTS

| | | |
|---|---|---|
| 2013/0285010 A1 | 10/2013 | Lu |
| 2014/0131760 A1 | 5/2014 | Chen et al. |
| 2017/0279020 A1 | 9/2017 | Kim et al. |
| 2019/0165207 A1 | 5/2019 | Kim et al. |
| 2019/0189596 A1 | 6/2019 | Chae et al. |
| 2019/0198565 A1 | 6/2019 | Lee et al. |
| 2020/0219858 A1* | 7/2020 | Chang ................ H01L 33/0093 |
| 2022/0392879 A1 | 12/2022 | Chae et al. |

FOREIGN PATENT DOCUMENTS

| | | |
|---|---|---|
| JP | 2007-227820 A | 9/2007 |
| JP | 2013-247269 A | 12/2013 |
| JP | 2019-514217 A | 5/2019 |
| KR | 20060080829 | 7/2006 |
| KR | 10-0765236 | 10/2007 |
| KR | 10-1100579 | 1/2012 |
| KR | 10-2016-0036865 | 4/2016 |
| WO | 2019103567 | 5/2019 |
| WO | 2019103577 | 5/2019 |

OTHER PUBLICATIONS

Non-Final Office Action mailed Nov. 26, 2021, in U.S. Appl. No. 17/020,834.

Notice of Allowance issued Mar. 9, 2022, in U.S. Appl. No. 17/020,834.

Corrected Notice of Allowability issued Apr. 19, 2022, in U.S. Appl. No. 17/020,834.

Notice of Allowance issued Jul. 18, 2023, in U.S. Appl. No. 17/873,040.

Extended European Search Report dated Sep. 25, 2023, issued in European Patent Application No. 20866486.2.

Japanese Office Action issued May 7, 2024 in Japanese Patent Application No. 2022-517511, 4 pages.

* cited by examiner

LIGHT EMITTING DEVICE FOR DISPLAY AND LIGHT EMITTING PACKAGE HAVING THE SAME

CROSS REFERENCE TO RELATED APPLICATIONS

This application is a continuation of U.S. patent application Ser. No. 17/873,040, filed on Jul. 25, 2022, which is a continuation of U.S. patent application Ser. No. 17/020,834, filed on Sep. 15, 2020, now issued as U.S. Pat. No. 11,398,462, which claims priority from and the benefit of U.S. Provisional Application No. 62/902,069, filed on Sep. 18, 2019, each of which is hereby incorporated by reference for all purposed as if fully set forth herein.

BACKGROUND

Field

Exemplary embodiments of the invention relate generally to a light emitting device for display and a light emitting package, and, more specifically, to a light emitting device for a display having a stacked structure of a plurality of LEDs and a light emitting package having the same.

Discussion of the Background

As an inorganic light source, light emitting diodes have been used in various technical fields including displays, vehicular lamps, general lighting, and the like. With various advantages of light emitting diodes over conventional light sources, such as longer lifespan, lower power consumption, and rapid response, light emitting diodes have been replacing conventional light sources.

Light emitting diodes have been used as backlight light sources in display apparatuses. However, LED displays that directly display images using the light emitting diodes have been recently developed.

In general, a display apparatus realizes various colors through mixture of blue, green, and red light. In order to display various images, the display apparatus include pixels that each includes sub-pixels corresponding to blue, green, and red light, respectively. As such, a color of a certain pixel is determined based on the colors of the sub-pixels, and images can be displayed through combination of such pixels.

Since LEDs can emit various colors depending upon materials thereof, it is possible to provide a display apparatus by arranging individual LED chips emitting blue, green, and red light on a two-dimensional plane. However, when one LED chip is provided for each sub-pixel, the number of LED chips may be increased, which may require excessive time for a mounting process during manufacture.

In addition, when the sub-pixels are arranged on a two-dimensional plane in the display apparatus, a relatively large area is occupied by one pixel that includes the sub-pixels for blue, green, and red light. Thus, an area of each LED chip should be reduced to arrange the sub-pixels in a restricted area. However, reduction in the sizes of the LED chips makes it difficult to mount the LED chips, as well as causing reduction in luminous areas of the LED chips.

Meanwhile, a display apparatus that realizes various colors needs to consistently provide high-quality white light. For example, conventional TVs use an RGB mixing ratio of 3:6:1 to realize the standard white light of D65. More particularly, luminous intensity of red is higher than that of blue, and luminous intensity of green is relatively the highest. However, in the conventional LED chips, a blue LED has relatively very high luminous intensity compared to that of other LEDs, and thus, it is difficult to match the RGB mixing ratio in the display apparatus using LED chips.

The above information disclosed in this Background section is only for understanding of the background of the inventive concepts, and, therefore, it may contain information that does not constitute prior art.

SUMMARY

Light emitting devices constructed according to exemplary embodiments of the invention are capable of increasing an area of each sub-pixel in a restricted pixel area and a display apparatus including the same.

Exemplary embodiments also provide a light emitting device for a display that is capable of reducing a time associated with a mounting process and a display apparatus including the same.

Exemplary embodiments further provide a light emitting device for a display that is capable of increasing production yield and a display apparatus including the same.

Exemplary embodiments still provide a light emitting device and a display apparatus that facilitates controlling an RGB mixing ratio.

Additional features of the inventive concepts will be set forth in the description which follows, and in part will be apparent from the description, or may be learned by practice of the inventive concepts.

A light emitting device for a display according to an exemplary embodiment includes a first LED sub-unit, a second LED sub-unit disposed on the first LED sub-unit, and a third LED sub-unit disposed on the second LED sub-unit, in which the third LED sub-unit is configured to emit light having a shorter wavelength than that of light emitted from the first LED sub-unit, and to emit light having a longer wavelength than that of light emitted from the second LED sub-unit.

The first, second, and third LED sub-units may be configured to emit red light, blue light, and green light, respectively.

The first LED sub-unit may include a first light emitting stack, the second LED sub-unit may include a second light emitting stack, the third LED sub-unit may include a third light emitting stack, and each of the light emitting stacks may include a first conductivity type semiconductor layer, an active layer, and a second conductivity type semiconductor layer.

The light emitting device may further include a substrate on which the first, second, and third LED sub-units are disposed, in which the third LED sub-unit may be disposed closer to the substrate than the first and second LED sub-units, and the substrate may have irregularities on an upper surface thereof.

The substrate may include a patterned sapphire substrate.

The first conductivity type semiconductor layer of the third LED stack may be in contact with the upper surface of the substrate.

The light emitting device may further include a first bonding layer interposed between the first LED sub-unit and the second LED sub-unit, and a second bonding layer interposed between the second LED sub-unit and the third LED sub-unit.

The light emitting device may further include a first connection electrode overlapping with at least one of the first, second, and third LED sub-units and electrically connected to at least one of the first, second, and third LED sub-units, in which the first connection electrode may have a first side surface of a first length and a second side surface of a second length and opposing the first side surface, and a difference between the first length and the second length may be greater than a thickness of at least one of the LED sub-units.

The light emitting device may further include a protection layer surrounding at least a portion of the first connection electrode and exposing a side surface of the substrate.

The first side surface may face the outside of the light emitting device, the second side surface may face a center of the light emitting device, and the first length of the first side surface may be greater than the second length of the second side surface.

The protection layer may include an epoxy molding compound or polyimide film, and the protection layer may cover an upper surface of the first LED sub-unit.

The light emitting device may further include a second connection electrode electrically connected to the first LED sub-unit, a third connection electrode electrically connected to the second LED sub-unit, and a fourth connection electrode electrically connected to the third LED sub-unit, in which the first connection electrode may be electrically connected to each of the first, second, and third LED sub-units.

The lower surfaces of the first, second, third, and fourth connection electrodes may be larger than the respective upper surfaces.

At least one of the first, second, third, and fourth connection electrodes may overlap a side surface of each of the first, second, third, and fourth LED sub-units.

The first LED sub-unit may include a first conductivity type semiconductor layer, an active layer, a second conductivity type semiconductor layer, and an upper contact electrode in ohmic contact with the first conductivity type semiconductor layer, the first conductivity type semiconductor layer may include a recessed portion, and the upper contact electrode may be formed in the recessed portion of the first conductivity type semiconductor layer.

A light emitting package according to another exemplary embodiment includes a circuit board, a light emitting device disposed on the circuit board, and a molding layer covering the light emitting device, in which the light emitting device includes a first LED sub-unit, a second LED sub-unit disposed on the first LED sub-unit, and a third LED sub-unit disposed on the second LED sub-unit, the third LED sub-unit is configured to emit light having a shorter wavelength than that of light emitted from the first LED sub-unit, and to emit light having a longer wavelength than that of light emitted from the second LED sub-unit.

The light emitting device may further include a substrate, the third LED sub-unit may be disposed closer to the substrate than the first and second LED sub-units, and the substrate may have irregularities on an upper surface thereof.

The light emitting device may further include a plurality of connection electrodes disposed on the first, second, and third LED sub-units, and a protection layer disposed between the connection electrodes, and the protection layer and the molding layer may include different materials from each other.

The first LED sub-unit may include a first conductivity type semiconductor layer, an active layer, a second conductivity type semiconductor layer, and an upper contact electrode in ohmic contact with the first conductivity type semiconductor layer, the first conductivity type semiconductor layer may include a recessed portion, and the upper contact electrode may be formed in the recessed portion of the first conductivity type semiconductor layer.

At least one of the connection electrodes may have a first side surface with a first length and a second side surface with a second length and opposing the first side surface, and a difference between the first length and second length may be at least 3 μm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 17 is a schematic cross-sectional view of a light emitting package according to an exemplary embodiment.

DETAILED DESCRIPTION

Figure 1A:
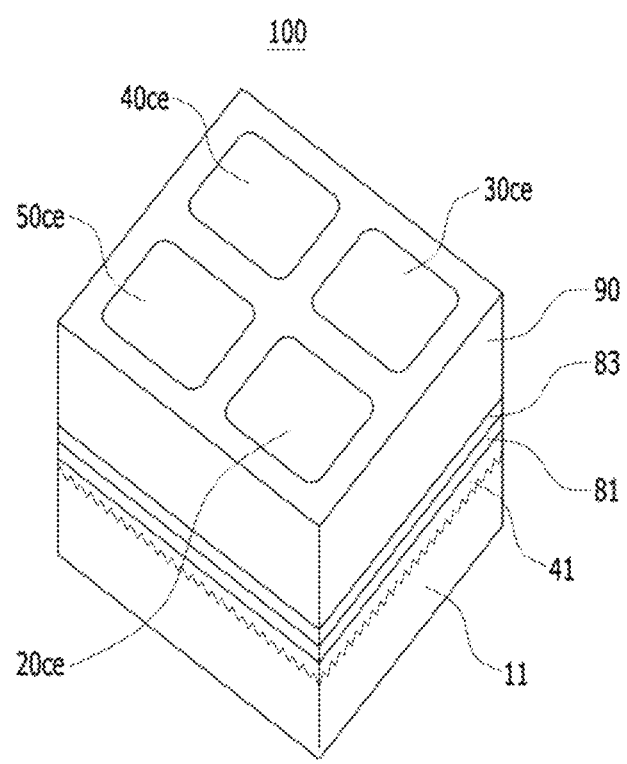
FIG. 1A shows a schematic perspective view of a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Hereinafter, exemplary embodiments will be described in detail with reference to the accompanying drawings. Hereinafter, a light emitting stacked structure, a light emitting device, or a light emitting package may include micro-LEDs, which may have a light emitting area of 10,000 $\mu m^2$ or less as known in the art. However, the micro-LEDs are not limited thereto, and may have a light emitting area of 4000 $\mu m^2$ or less, and further, 2500 $\mu m^2$ or less depending on applications.

Figure 1B:
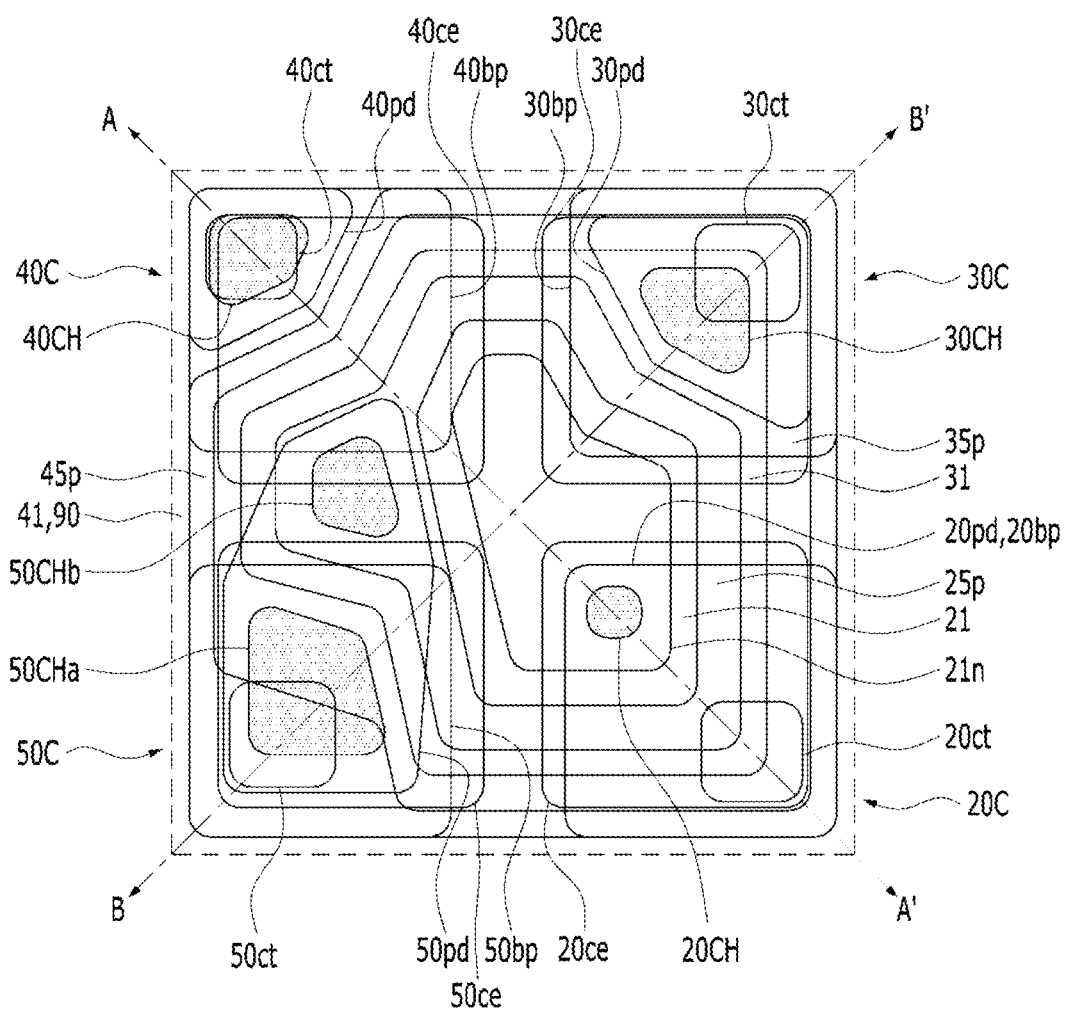
FIG. 1B is a schematic plan view of the light emitting device of FIG. 1A.
Figure 1C:
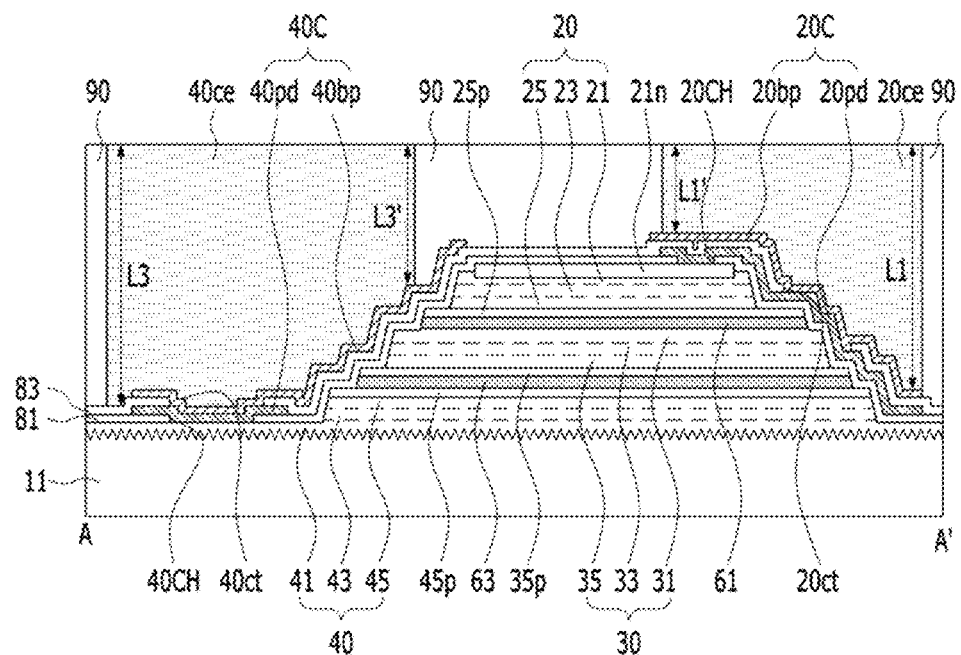
FIG. 1C and FIG. 1D are schematic cross-sectional views taken along lines A-A' and B-B' of FIG. 1B, respectively.
Figure 1D:
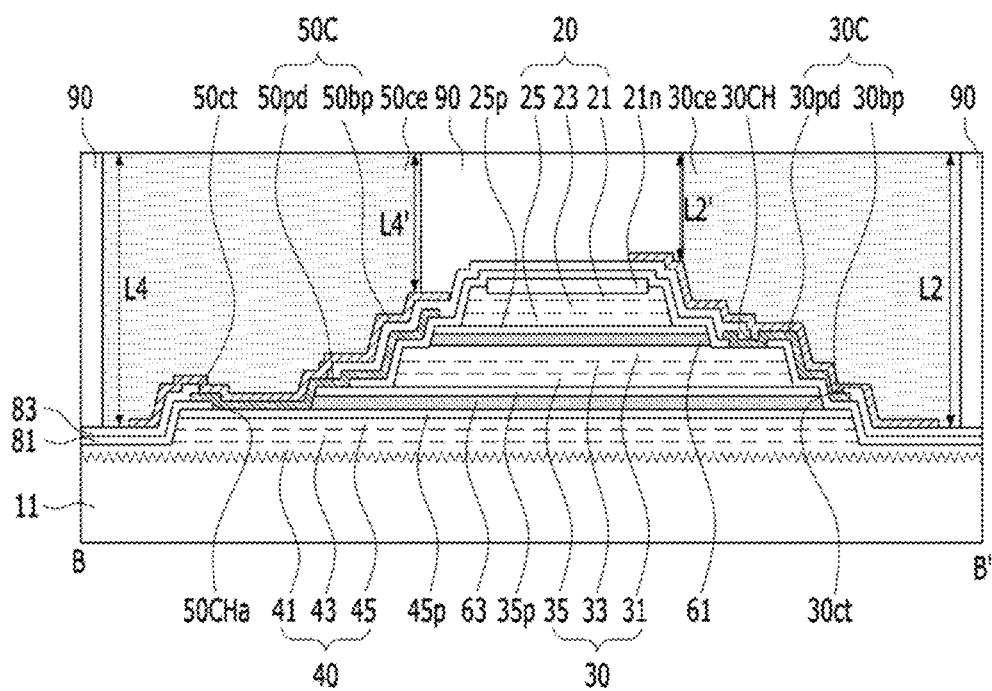
Figure 1E:
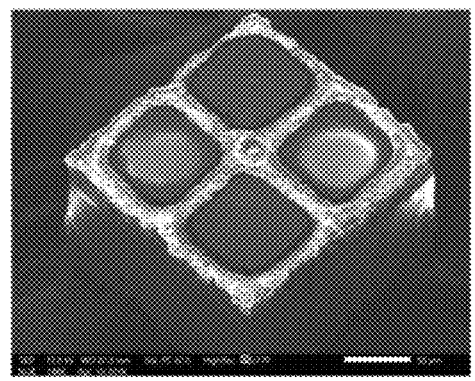
FIG. 1E is a SEM image of the light emitting device of FIG. 1A.

FIG. 1A shows a schematic perspective view of a light emitting device according to an exemplary embodiment. FIG. 1B is a schematic plan view of the light emitting device of FIG. 1A. FIG. 1C and FIG. 1D are schematic cross-sectional views taken along lines A-A' and B-B' of FIG. 1B, respectively, and FIG. 1E is a SEM image of the light emitting device of FIG. 1A.

Referring to FIGS. 1A and 1B, a light emitting device 100 includes a light emitting stacked structure, a first connection electrode 20*ce*, a second connection electrode 30*ce*, a third connection electrode 40*ce*, and a fourth connection electrode 50*ce* formed on the light emitting stacked structure, and a protection layer 90 surrounding the connection electrodes 20*ce*, 30*ce*, 40*ce*, and 50*ce*. An array of light emitting devices 100 may be formed on a substrate 11. The light emitting device 100 illustrated in FIG. 1A shows a singularized one from the array, and thus, may be referred to as a light emitting device. Formation and singularization of the light emitting devices 100 will be described later in more detail. In some exemplary embodiments, the light emitting device 100 including the light emitting stacked structure may be further processed to be formed into a light emitting package, which will also be described later in more detail. Referring to FIG. 1A and FIG. 1D, the light emitting device 100 according to the illustrated exemplary embodiment may include a light emitting stacked structure, and include a first LED sub-unit, a second LED sub-unit, and a third LED sub-unit disposed on a substrate. The first LED sub-unit may include a first light emitting stack 20, the second LED sub-unit may include a second light emitting stack 30, and the third LED sub-unit may include a third light emitting stack 40. The light emitting stacked structure is exemplarily shown to include three light emitting stacks 20, 30, and 40, but the inventive concepts are not limited to a specific number of light emitting stacks. For example, in some exemplary embodiments, the light emitting stacked structure may include two or more of light emitting stacks. Hereinafter, the light emitting stacked structure will exemplarily be described as including three light emitting stacks 20, 30, and 40.

The substrate 11 may include a light-transmitting insulating material to transmit light. However, in some exemplary embodiments, the substrate 11 may be translucent or partially transparent to transmit only light having a specific wavelength or only a portion of light having a specific wavelength. The substrate 11 may be a growth substrate on which the third light emitting stack 40 can be epitaxially grown, for example, a sapphire substrate. However, the substrate 11 is not limited to the sapphire substrate, and may include other various transparent insulating materials. For example, the substrate 11 may include glass, quartz, silicon, an organic polymer, or an organic-inorganic composite material, such as silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate 11 may include irregularities on an upper surface thereof, and for example, may be a patterned sapphire substrate. By including irregularities on the upper surface of the substrate 11, it is possible to increase extraction efficiency of light generated in the third light emitting stack 40 which is in contact with the substrate 11. The irregularities of the substrate 11 may be included to selectively increase luminous intensity of the third LED stack 40 compared to those of the first LED stack and the second LED stack 30.

The first, second, and third light emitting stacks 20, 30, and 40 are configured to emit light toward the substrate 11. Accordingly, light emitted from the first light emitting stack 20 may pass through the second and third light emitting stacks 30 and 40. In an exemplary embodiment, the first, second, and third light emitting stacks 20, 30, and 40 may emit light having different peak wavelengths from one another. In general, a light emitting stack disposed relatively further away from the substrate 11 emits light having a longer wavelength than that of light emitted from a light emitting stack disposed closer to the substrate 11, and thus, light loss may be reduced. However, the light emitting device 100 according to the illustrated exemplary embodiment may facilitate adjusting a color mixing ratio of the first, second, and third light emitting stacks 20, 30, and 40, by forming the second LED stack 30 to emit light having a shorter wavelength than that of light emitted from the third LED stack 40. Accordingly, luminous intensity of the second LED stack 30 may be reduced, and luminous intensity of the third LED stack 40 may be increased, and thus, luminous intensity ratios of light emitted from the first, second, and third light emitting stacks may be greatly changed. For example, the first light emitting stack 20 may be configured to emit red light, the second light emitting stack 30 may be configured to emit blue light, and the third light emitting stack 40 may be configured to emit green light. In this case, luminous intensity of blue light may be relatively reduced, and luminous intensity of green light may be relatively increased, and thus, luminous intensity ratios of red, green, and blue light may be easily adjusted to approach 3:6:1.

Moreover, light emitting areas of the first, second, and third LED stacks 20, 30, and 40 may be about 10000 $\mu m^2$ or less, and further, 4000 $\mu m$ 2, furthermore, 2500 $\mu m^2$ or less. In addition, as the light emitting stack is disposed closer to the substrate 11, the emitting area thereof may be larger. In this manner, the third LED stack 40 that emits green light is disposed closest to the substrate 11, and thus, luminous intensity of green light may be further increased.

The first light emitting stack 20 includes a first conductivity type semiconductor layer 21, an active layer 23, and a second conductivity type semiconductor layer 25. According to an exemplary embodiment, the first light emitting stack 20 may include a semiconductor material, such as AlGaAs, GaAsP, AlGaInP, and GaP that emits red light, but the inventive concepts are not limited thereto.

A first upper contact electrode 21n may be disposed on the first conductivity type semiconductor layer 21 and may be in ohmic contact with the first conductivity type semiconductor layer 21. A first lower contact electrode 25p may be disposed under the second conductivity type semiconductor layer 25. According to an exemplary embodiment, a portion of the first conductivity type semiconductor layer 21 may be patterned, and the first upper contact electrode 21n may be disposed in a patterned region of the first conductivity type semiconductor layer 21 to increase an ohmic contact level. The first upper contact electrode 21n may have a single-layer structure or a multiple-layer structure, and may include Al, Ti, Cr, Ni, Au, Ag, Sn, W, Cu, or an alloy thereof, such as Au—Te alloy or Au—Ge alloy, but the inventive concepts are not limited thereto. In an exemplary embodiment, the first upper contact electrode 21n may have a thickness of about 100 nm, and may include metal having high reflectivity to increase light emission efficiency in a downward direction toward the substrate 11.

The second light emitting stack 30 includes a first conductivity type semiconductor layer 31, an active layer 33, and a second conductivity type semiconductor layer 35. According to an exemplary embodiment, the second light emitting stack 30 may include a semiconductor material, such as GaN, InGaN, ZnSe that emits blue light, but the inventive concepts are not limited thereto. A second lower contact electrode 35p is disposed under the second conductivity type semiconductor layer 35 of the second light emitting stack 30.

The third light emitting stack 40 includes a first conductivity type semiconductor layer 41, an active layer 43, and a second conductivity type semiconductor layer 45. According to an exemplary embodiment, the third light emitting stack 40 may include a semiconductor material, such as GaN, InGaN, GaP, AlGaInP, AlGaP, or the like that emits green light. A third lower contact electrode 45p is disposed on the second conductivity type semiconductor layer 45 of the third light emitting stack 40.

According to an exemplary embodiment, each of the first conductivity type semiconductor layers 21, 31, and 41 and the second conductivity type semiconductor layers 25, and 45 of the first, second, and third light emitting stacks 20, 30, and 40 may have a single-layer structure or a multiple-layer structure, and, in some exemplary embodiments, may include a superlattice layer. Moreover, the active layers 23, 33, and 43 of the first, second, and third light emitting stacks 20, 30, and 40 may have a single-quantum well structure or a multiple-quantum well structure.

Each of the first, second, and third lower contact electrodes 25p, 35p, and 45p may include a transparent conductive material that transmits light. For example, the lower contact electrodes 25p, 35p, and 45p may include transparent conductive oxide (TCO), such as SnO, InO$_2$, ZnO, ITO, ITZO, or the like, without being limited thereto.

A first adhesive layer 61 is disposed between the first light emitting stack 20 and the second light emitting stack 30, and a second adhesive layer 63 is disposed between the second light emitting stack 30 and the third light emitting stack 40. The first and second adhesive layers 61 and 63 may include a non-conductive material that transmits light. For example, the first and second adhesive layers 61 and 63 may include an optically clear adhesive (OCA), which is epoxy, polyimide, SUB, spin-on-glass (SOG), benzocyclobutene (BCB), but the inventive concepts are not limited thereto.

According to the illustrated exemplary embodiment, a first insulation layer 81 and a second insulation layer 83 are disposed on at least a portion of side surfaces of the first, second, and third light emitting stacks 20, 30, and 40. At least one of the first and second insulation layers 81 and 83 may include various organic or inorganic insulating materials, such as polyimide, SiO$_2$, SiN$_x$, Al$_2$O$_3$, or the like. For example, at least one of the first and second insulation layers 81 and 83 may include a distributed Bragg reflector (DBR). As another example, at least one of the first and second insulation layers 81 and 83 may include a black organic polymer. In some exemplary embodiments, an electrically floating metal reflection layer may be disposed on the first and second insulation layers 81 and 83 and may reflect light emitted from the light emitting stacks 20, 30, and 40 toward the substrate 11. In some exemplary embodiments, at least one of the first and second insulation layers 81 and 83 may have a single-layer structure or a multiple-layer structure formed of two or more insulation layers having different refractive indices.

According to an exemplary embodiment, each of the first, second, and third light emitting stacks 20, 30, and 40 may be driven independently. More specifically, a common voltage may be applied to one of the first and second conductivity type semiconductor layers of each of the light emitting stacks, and an individual emission signal may be applied to the remaining one of the first and second conductivity type semiconductor layers of each of the light emitting stacks. For example, according to an exemplary embodiment, the first conductivity type semiconductor layers 21, 31, and 41 of each of the light emitting stacks 20, 30, and 40 may be n-type, and the second conductivity type semiconductor layers 25, 35, and 45 of each of the light emitting stacks 20, 30, and 40 may be p-type. In this case, the third light emitting stack 40 may have a stacked sequence that is opposite to those of the first light emitting stack 20 and the second light emitting stack 30. More particularly, the p-type semiconductor layer 45 may be disposed over the active layer 43 to simplify processes of manufacturing the light emitting device 100. Hereinafter, the first conductivity type and the second conductivity type semiconductor layers may also be referred as n-type and p-type, respectively. However, in some exemplary embodiments, n-type and p-type may be reversed.

Each of the first, second, and third lower contact electrodes 25p, 35p, and 45p that are connected to the p-type semiconductor layers 25, 35, and 45 of the light emitting stacks, respectively, may be electrically connected to a fourth contact 50C. The fourth contact 50C may be connected to the fourth connection electrode 50ce to receive a common voltage from the outside. Meanwhile, the n-type semiconductor layers 21, 31, and 41 of the light emitting stacks may be connected to a first contact 20C, a second contact 30C, and a third contact 40C, respectively, and may receive corresponding emission signals through the connection electrodes 20ce, 30ce, and 40ce, respectively. In this manner, each of the first, second, and third light emitting stacks 20, 30, and 40 may be driven independently from one another while having a common p-type light emitting stacked structure.

The light emitting device 100 according to the illustrated exemplary embodiment has the common p-type structure, but the inventive concepts are not limited thereto. For example, in some exemplary embodiments, the first conductivity type semiconductor layers 21, 31, and 41 of each of the light emitting stacks may be p-type, and the second conductivity type semiconductor layer 25, 35, and 45 of each of the light emitting stacks may be n-type, and a common n-type light emitting stacked structure may be formed. In addition, in some exemplary embodiments, the stacked sequence of each of the light emitting stacks is not limited to that shown in the drawing, but may be variously modified. Hereinafter, the light emitting device 100 will exemplarily be described as having the common n-type light emitting stacked structure.

According to the illustrated exemplary embodiment, the first contact 20C includes a first pad 20pd and a first bump electrode 20bp electrically connected to the first pad 20pd. The first pad 20pd is disposed on the first upper contact electrode 21n of the first light emitting stack and is connected to the first upper contact electrode 21n through a first contact hole 20CH defined through the first insulation layer 81. At least a portion of the first bump electrode 20bp may be overlapped with the first pad 20pd, and the first bump electrode 20bp is connected to the first pad 20pd through a first through hole 20ct with the second insulation layer 83 interposed therebetween in the overlapped region between the first bump electrode 20bp and the first pad 20pd. In this case, the first pad 20pd and the first bump electrode 20bp may have substantially the same shape and overlap each other, but the inventive concepts are not limited thereto.

The second contact 30C includes a second pad 30pd and a second bump electrode electrically connected to the second pad 30pd. The second pad 30pd is disposed on the first conductivity type semiconductor layer 31 of the second light emitting stack 30, and is connected to the first conductivity type semiconductor layer 31 through a second contact hole 30CH defined through the first insulation layer 81. A portion of the second bump electrode 30bp may be overlapped with the second pad 30pd. The second bump electrode 30bp may be connected to the second pad 30pd through a second through hole 30ct with the second insulation layer 83 interposed therebetween in the overlapped region between the second bump electrode 30bp and the second pad 30pd.

The third contact 40C includes a third pad 40pd and a third bump electrode 40bp electrically connected to the third pad 40pd. The third pad 40pd is disposed on the first conductivity type semiconductor layer 41 of the third light emitting stack 40, and is connected to the first conductivity type semiconductor layer 41 through a third contact hole 40CH defined through the first insulation layer 81. A portion of the third bump electrode 40bp may be overlapped with the third pad 40pd. The third bump electrode 40bp may be connected to the third pad 40pd through a third through hole 40ct with the second insulation layer 83 interposed therebetween in the overlapped region between the third bump electrode 40bp and the third pad 40pd.

The fourth contact 50C includes a fourth pad 50pd and a fourth bump electrode electrically connected to the fourth pad 50pd. The fourth pad 50pd is connected to the second conductivity type semiconductor layers 25, 35, and 45 of the first, second, and third light emitting stacks 20, 30, and 40 through a first sub-contact hole 50CHa and a second sub-contact defined on the first, second and third lower contact electrodes 25p, 35p and 45p of the first, second and third light emitting stacks 20, 30 and 40. In particular, the fourth pad 50pd is connected to the first lower contact electrode 25p through the second sub-contact hole 50CHb, and is connected to the second and third lower contact electrodes 35p and 45p through the first sub-contact hole 50CHa. In this manner, the fourth pad 50pd may be connected to the second and third lower contact electrodes 35p and 45p through a single first sub-contact hole 50CHa, so that the process of manufacturing the light emitting device 100 may be simplified and an area occupied by the contact holes in the light emitting device 100 may be reduced. At least a portion of the fourth bump electrode 50bp may be overlapped with the fourth pad 50pd. The fourth bump electrode 50bp may be connected to the fourth pad 50pd through a fourth through hole 50ct with the second insulation layer 83 interposed therebetween in the overlapped region between the fourth bump electrode 50bp and the fourth pad 50pd.

The inventive concepts are not limited to a specific structures of the contacts 20C, 30C, 40C, and 50C. For example, in some exemplary embodiments, the bump electrode 20bp, 30bp, 40bp, or 50bp may be omitted from at least one of the contacts 20C, 30C, 40C, and 50C. In this case, the pads 20pd, 30pd, 40pd, and 50pd of the contacts 20C, 30C, 40C, and 50C may be connected to respective connection electrodes 20ce, 30ce, 40ce, and 50ce. In other exemplary embodiments, the bump electrodes 20bp, 30bp, 40bp, and 50bp may be omitted from each of the contacts 20C, 30C, 40C, and 50C, and the pads 20pd, 30pd, 40pd, and 50pd of the contacts 20C, 40C, and 50C may be directly connected to the corresponding connection electrodes 20ce, 30ce, 40ce, and 50ce.

According to an exemplary embodiment, the first, second, third, and fourth contacts 20C, 30C, 40C, and 50C may be formed at various locations. For example, when the light emitting device 100 is substantially rectangular as shown in the drawing, the first, second, third, and fourth contacts 20C, 30C, 40C, and 50C may be disposed around each corner of the rectangular shape. However, the inventive concepts are not limited thereto, and, in some exemplary embodiments, the light emitting device 100 may be formed to have various shapes, and the first, second, third, and fourth contacts 20C, 30C, 40C, and 50C may be formed at different locations depending on the shape of the light emitting device.

The first, second, third, and fourth pads 20pd, 30pd, 40pd, and 50pd are spaced apart and insulated from one another. In addition, the first, second, third, and fourth bump electrodes 20bp, 30bp, 40bp, and 50bp are spaced apart and insulated from one another.

According to an exemplary embodiment, each of the first, second, third, and fourth bump electrodes 20bp, 30bp, 40bp, and 50bp may cover at least a portion of side surfaces of the first, second, and third light emitting stacks 20, 30, and 40. In this manner, heat generated from the first, second, and third light emitting stacks 20, 30, and 40 may be easily dissipated.

According to the illustrated exemplary embodiment, each of the connection electrodes 20ce, 30ce, 40ce, and 50ce may have a substantially elongated shape that protrudes from the substrate 11. The connection electrodes 20ce, 30ce, 40ce, and 50ce may include metal, such as Cu, Ni, Ti, Sb, Zn, Mo, Co, Sn, Ag, or an alloy thereof, but the inventive concepts are not limited thereto. For example, each of the connection electrodes 20ce, 30ce, 40ce, and 50ce may include two or more metals or a plurality of different metal layers to reduce stress from the elongated shape of the connection electrodes 20ce, 30ce, 40ce, and 50ce. In another exemplary embodiment, when the connection electrodes 20ce, 30ce, 40ce, and 50ce contain Cu, an additional metal may be deposited or plated to inhibit oxidation of Cu. In some exemplary embodiments, when the connection electrodes 20ce, 30ce, 40ce, and 50ce include Cu/Ni/Sn, Cu may prevent Sn from permeating into the light emitting stacked structure. In some exemplary embodiments, the connection electrodes 20ce, 30ce, 40ce, and 50ce may include a seed layer for forming a metal layer in a plating process, which will be described later.

As shown in the drawings, each of the connection electrodes 20ce, 30ce, 40ce, and 50ce may have a substantially flat upper surface, thereby facilitating electrical connection between external lines (which will be described later) or electrodes and the light emitting stacked structure. According to the illustrated exemplary embodiment, when the light emitting device 100 includes micro LEDs having a surface area of about 10,000 μm$^2$ or less as known in the art, or include micro LEDs having a surface area of about 4,000 μm$^2$ or about 2,500 μm$^2$ or less, the connection electrodes 20ce, 30ce, 40ce, and 50ce may be overlapped with at least a portion of one of the first, second, and third light emitting stacks 20, 30, and 40 as shown in the drawing. More specifically, the connection electrodes 20ce, 30ce, 40ce, and 50ce may be overlapped with at least one step that is formed on the side surface of the light emitting stacked structure. As such, since an area of a lower surface of the connection electrode is greater than that of an upper surface thereof, a larger contact area may be formed between the connection electrode 20ce, 30ce, 40ce, and 50ce and the light emitting stacked structure. Accordingly, the connection electrodes 20ce, 30ce, 40ce, and 50ce may be more stably formed on the light emitting stacked structure than those in a conventional light emitting device. For example, lengths L1, L2, L3, and L4 of one side surface that faces the outside of the connection electrodes 20ce, 30ce, 40ce, and may be different from lengths L1', L2', L3', and L4' of one side surface that faces toward a center of the light emitting device 100. More specifically, the length of one side surface of the connection electrode that faces the outside may be greater than that of another side surface that faces the center of the light emitting device 100. For example, a difference in lengths L and L' of two surfaces opposite to each other may be greater than a thickness (or height) of one of the light emitting stacks 20, 30, and 40. In this manner, the structure of the light emitting device 100 may be strengthened with a larger contact area between the connection electrodes 20ce, 30ce, 40ce, and 50ce and the light emitting stacked structure. In addition, since the connection electrodes 30ce, 40ce, and 50ce may be overlapped with at least one step that is formed on the side surface of the light emitting stacked structure, heat generated in the light emitting stacked structure may be dissipated to the outside more efficiently.

According to an exemplary embodiment, a difference between the length L1, L2, L3 or L4 of one side surface of the connection electrode that faces the outside and the lengths L1', L2' L3', and L4' of the another side surface that faces the center of the light emitting device 100 may be about 3 μm. In this case, the light emitting stacked structure may be formed thinly, and in particular, the first light emitting stack 20 may have a thickness of about 1 μm, the second light emitting stack 30 may have a thickness of about 0.7 μm, the third light emitting stack 40 may have a thickness of about 0.7 μm, and each of the first and second adhesive layers may have a thickness of about 0.2 μm to about 0.3 μm, but the inventive concepts are not limited thereto. According to another exemplary embodiment, a difference between the length L1, L2, L3 or L4 of one side surface of the connection electrode that faces to the outside and the lengths L1', L2' L3', and L4' of the another side surface that faces the center of the light emitting device 100 may be about 10 μm to about 16 μm. In this case, the light emitting stacked structure may be formed relatively thick and has more stable structure, and in particular, the first light emitting stack 20 may have a thickness of about 4 μm to about 5 μm, the second light emitting stack 30 may have a thickness of about 3 μm, the third light emitting stack 40 may have a thickness of about 3 μm, and each of the first and second adhesive layers may have a thickness of about 0.3 μm, but the inventive concepts are not limited thereto. According to another exemplary embodiment, a difference between the length L1, L2, L3 or L4 of one side surface of the connection electrode that faces to the outside and the lengths L1', L2' L3', and L4' of the another side surface that faces the center of the light emitting device 100 may be about 25% of a length of a largest side surface. However, the inventive concepts are not limited to a particular difference in lengths between the two surfaces of the connection electrode opposite to each other, and the difference in lengths between the two surfaces opposite to each other may be changed.

In some exemplary embodiments, at least one of the connection electrodes 20ce, 30ce, 40ce, and 50ce may be overlapped with the side surface of each of the light emitting stacks 30, and 40, and thus, the light emitting stacks 20, 30, and 40 may efficiently dissipate heat that is generated inside thereof. Further, when the connection electrodes 20ce, 30ce, 40ce, and include a reflective material such as metal, the connection electrodes 20ce, 30ce, 40ce, and may reflect light that is emitted from at least one or more of the light emitting stacks 20, 30, and 40, and thus, luminous efficiency may be improved.

In general, during the manufacturing process, an array of a plurality of light emitting devices is formed on a substrate. The substrate is cut along a scribing line to singularize (separate) each of the light emitting devices, and the light emitting device may be transferred to another substrate or a tape using various transfer techniques for further processing of the light emitting devices, such as packaging. In this case, when the light emitting device includes connection electrodes such as metal bumps or pillars protruding outward from the light emitting structure, due to the structure of the light emitting device exposing the connection electrodes to the outside, during a subsequent process, for example, a transfer stage, various problems may occur. In addition, when the light emitting device contains micro-LEDs with a surface area of about 10,000 μm² or less, of about 4,000 μm² or less, or about 2,500 μm² or less, depending on the application, handling of the light emitting device may be more difficult due to a small form factor.

For example, when the connection electrode has a substantially elongated shape such as a rod, transferring the light emitting device using a conventional vacuum method may become difficult because the light emitting device may not have a sufficient suction area due to the protruding structure of the connection electrode. In addition, the exposed connection electrode may be directly affected by various stresses during a subsequent process, such as when the connection electrode contacts a manufacturing apparatus, which may damage the structure of the light emitting device. As another example, when the light emitting device is transferred by attaching an adhesive tape on the upper surface of the light emitting device (for example, a surface opposite to the substrate), a contact area between the light emitting device and the adhesive tape may be limited to the upper surface of the connection electrode. In this case, contrary to a case when the adhesive tape is attached to the lower surface of the light emitting device, such as the substrate, an adhesive force of the light emitting device to the adhesive tape may be weakened, and the light emitting device may be undesirably separated from the adhesive tape while transferring the light emitting device. As still another example, when transferring the light emitting device using a conventional pick-and-place method, a discharge pin may directly contact a portion of the light emitting device disposed between connection pins, and thus, an upper structure of the light emitting structure may be damaged. In particular, the discharge pin may hit the center of the light emitting device, and cause physical damage to an upper light emitting stack of the light emitting device. This impact on the light emitting device by the discharge pin is shown in FIG. 1E, in which the center of the light emitting device 100 is pressed by the discharge pin.

According to an exemplary embodiment, the protection layer 90 may be formed on the light emitting stacked structure. More specifically, as shown in FIG. 1A, the protection layer 90 may be formed between the connection electrodes 20ce, 30ce, 40ce, and 50ce to cover at least the side surface of the light emitting stacked structure. According to the illustrated exemplary embodiment, the protection layer 90 may expose side surfaces of the substrate 11, the first and second insulation layers 81 and 83, and a portion of the third light emitting stack 40. The protection layer 90 may be formed to be substantially flush with the upper surfaces of the connection electrodes 20ce, 30ce, 40ce, and 50ce, and may include an epoxy molding compound (EMC), which may be formed in various colors, such as black, white, or transparent. However, the inventive concepts are not limited thereto. For example, in some exemplary embodiments, the protection layer 90 may include polyimide (PID), and in this case, PID may be provided as a dry film rather than a liquid type to increase flatness when PID is applied to the light emitting stacked structure. In some exemplary embodiments, the protection layer 90 may include a photosensitive substance. In this manner, the protection layer 90 may provide a sufficient contact area to the light emitting device 100 to facilitate handling during the subsequent transfer step, as well as protecting the light emitting structure from external impacts that may be applied during subsequent processes. In addition, the protection layer 90 may prevent light leakage from the side surface of the light emitting device 100 to prevent or at least to suppress interference of light emitted from an adjacent light emitting device 100.

Figure 2:
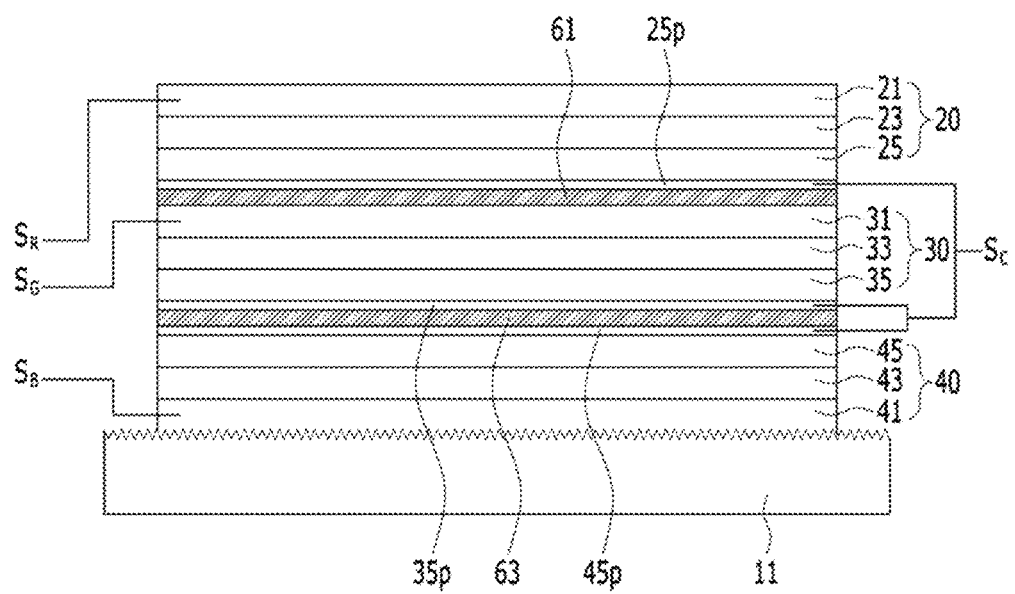
FIG. 2 is a schematic cross-sectional view of a light emitting stacked structure according to an exemplary embodiment.

FIG. 2 is a schematic cross-sectional view of a light emitting stacked structure according to an exemplary embodiment. Since the light emitting stacked structure according to the illustrated exemplary embodiment is substantially the same as that included in the above-described light emitting device 100, repeated descriptions of substantially the same elements will be omitted to avoid redundancy.

Referring to FIG. 2, first, second, and third lower contact electrodes 25p, 35p, and 45p according to an exemplary embodiment may be connected to a common line to which a common voltage Sc is applied. Emission signal lines SR, SG, and SB may be connected to the first conductivity type semiconductor layers 21, 31, and 41 of the first, second, and third light emitting stacks 20, 30, and 40, respectively. The emission signal line is connected to the first conductivity type semiconductor layer 21 of the first light emitting stack 20 through a first upper contact electrode 21n. In the illustrated exemplary embodiment, the common voltage Sc is applied to the first, second, and third lower contact electrodes 25p, 35p, and 45p through the common line, and the emission signals are applied to the first conductivity type semiconductor layers 21, 31, and 41 of the first, second, and third light emitting stacks 20, 30, and 40 through the emission signal lines, respectively. In this manner, the first, second, and third light emitting stacks 20, 30, and 40 may be individually controlled to selectively emit light.

FIG. 2 exemplarily shows the light emitting stacked structure having the p-common structure, but the inventive concepts are not limited thereto. For example, in some exemplary embodiments, the common voltage Sc may be applied to the first conductivity type (or n-type) semiconductor layers 21, 31 and 41 of the first, second and third light emitting stacks 20, 30 and 40, and the emission signal may be applied to the second conductivity type (or p-type) semiconductor layers 25, 35, and 45 of the first, second, and third light emitting stacks 20, 30, and 40.

The light emitting stacked structure according to an exemplary embodiment may display light having various colors according to an operating state of each of the light emitting stacks 20, 30, and 40, whereas conventional light emitting devices may display a variety of colors in a combination of multiple light emitting cells that emit light of a single color. More specifically, conventional light emitting devices generally include light emitting cells spaced apart from one another along a two-dimensional plane and emitting light of different colors, for example, red, green, and blue, respectively, to realize a full color display. As such, a relatively large area may be occupied by conventional light emitting cells. However, the light emitting stacked structure according to an exemplary embodiment may emit light having different colors by stacking a plurality of light emitting stacks 20, 30, and 40. In this manner, the light emitting stacked structure may provide a high level of integration and realize full color display through a smaller area than that of the conventional light emitting apparatus.

In addition, when the light emitting devices 100 are mounted on another substrate to manufacture a display apparatus, the number of devices to be mounted may be significantly reduced as compared to the conventional light emitting device. More particularly, when hundreds of thousands or millions of pixels are formed in one display apparatus, manufacturing of the display apparatus using the light emitting device 100 may be substantially simplified.

According to an exemplary embodiment, the light emitting stacked structure may further include various additional elements to improve purity and efficiency of light emitted therefrom. For example, in some exemplary embodiments, a wavelength pass filter may be disposed between the light emitting stacks. In some exemplary embodiments, an irregularity portion may be formed on a light emission surface of at least one of the light emitting stacks to balance brightness of light between the light emitting stacks. For example, luminous intensity of green light needs to be increased to make the RGB mixing ratio close to 3:6:1. As such, irregularities may be formed on the surface of the substrate 11 as described above.

Hereinafter, a method of forming the light emitting device 100 according to an exemplary embodiment will be described with reference to the accompanying drawings.

FIGS. 3A, 4A, 5A, 6A, 7A, and 8A are plan views illustrating processes of manufacturing the light emitting device of FIG. 1A according to an exemplary embodiment. FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment. FIG. 9 is a schematic cross-sectional view of the light emitting device of FIG. 1A according to an exemplary embodiment. FIGS. 10, 11, 12, and 13 are cross-sectional views schematically showing processes of manufacturing the light emitting device of FIG. 1A according to an exemplary embodiment.

Referring back to FIG. 2, the first conductivity type semiconductor layer 41, the third active layer 43, and the second conductivity type semiconductor layer 45 of the third light emitting stack 40 may be sequentially grown on the substrate 11 by, for example, a metal organic chemical vapor deposition (MOCVD) method or a molecular beam epitaxy (MBE) method. The substrate 11 may include an irregularity pattern on an upper surface thereof, and may be, for example, a patterned sapphire substrate. The third lower contact electrode 45p may be formed on the third p-type semiconductor layer 45 by, for example, a physical vapor deposition or chemical vapor deposition method, and may include transparent conductive oxide (TCO), such as SnO, $InO_2$, ZnO, ITO, ITZO, or the like. When the third light emitting stack 40 emits green light according to an exemplary embodiment, the substrate 11 may include $Al_2O_3$ (for example, a sapphire substrate), and the third lower contact electrode 45p may include transparent conductive oxide (TCO), such as tin oxide. The first and second light emitting stacks 20 and 30 may be similarly formed by sequentially growing the first conductivity type semiconductor layer, the active layer, and the second conductivity type semiconductor layer on a temporary substrate, respectively. The lower contact electrodes including transparent conductive oxide (TCO) may be formed by, for example, a physical vapor deposition or chemical vapor deposition method on the second conductivity type semiconductor layer, respectively. In addition, the first and second light emitting stacks 20 and 30 may be coupled to each other with the first adhesive layer 61 interposed therebetween, and at least one of the temporary substrates of the first and second light emitting stacks 20 and 30 may be removed by a laser lift-off process, a chemical process, a mechanical process, or the like. The first and second light emitting stacks 20 and 30 may be coupled to the third light emitting stack 40 with the second adhesive layer 63 therebetween, and the remaining one of the temporary substrates of the first and second light emitting stacks 20 and may be removed by a laser lift-off process, a chemical process, a mechanical process, or the like.

Figure 3A:
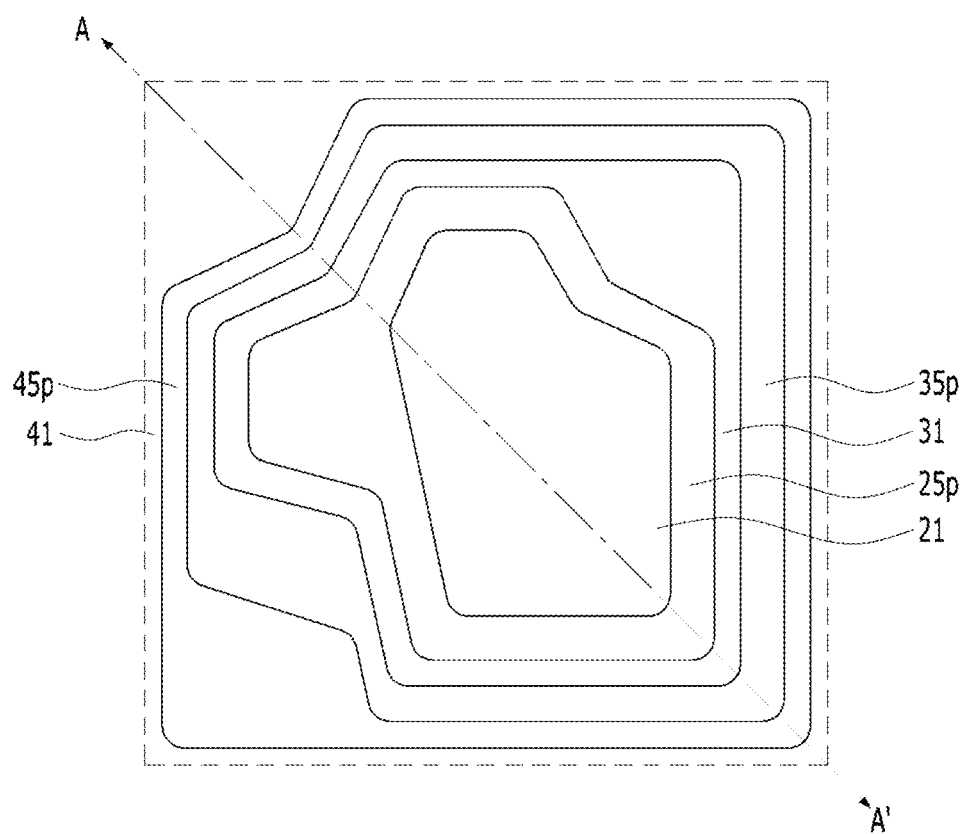
FIGS. 3A, 4A, 5A, 6A, 7A, and 8A are plan views illustrating a process of manufacturing the light emitting device of FIG. 1A according to an exemplary embodiment.
Figure 3B:
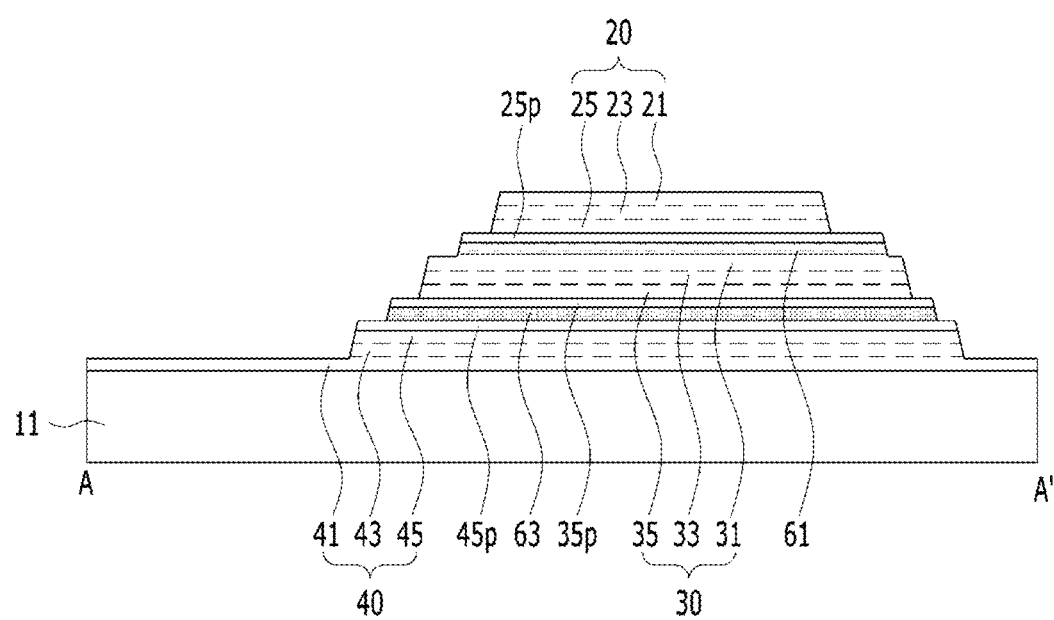
FIGS. 3B, 4B, 5B, 6B, 7B, and 8B are cross-sectional views taken along line A-A' of the corresponding plan views shown in FIGS. 3A, 4A, 5A, 6A, 7A, and 8A according to an exemplary embodiment.
Figure 4A:
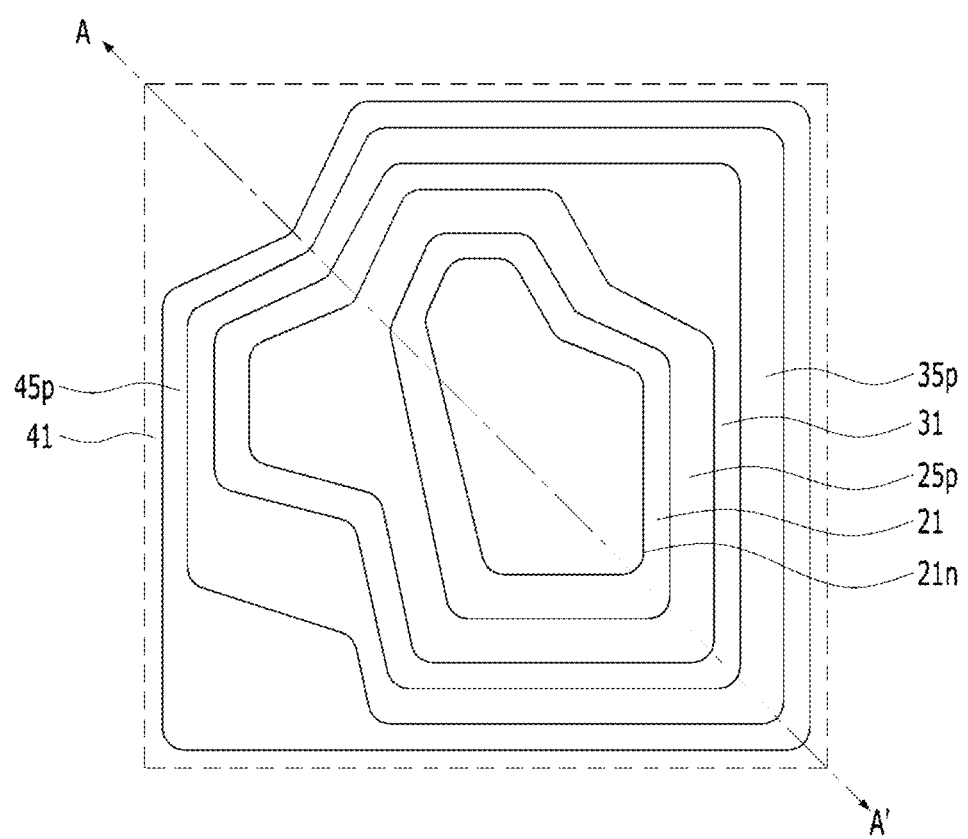
Figure 4B:
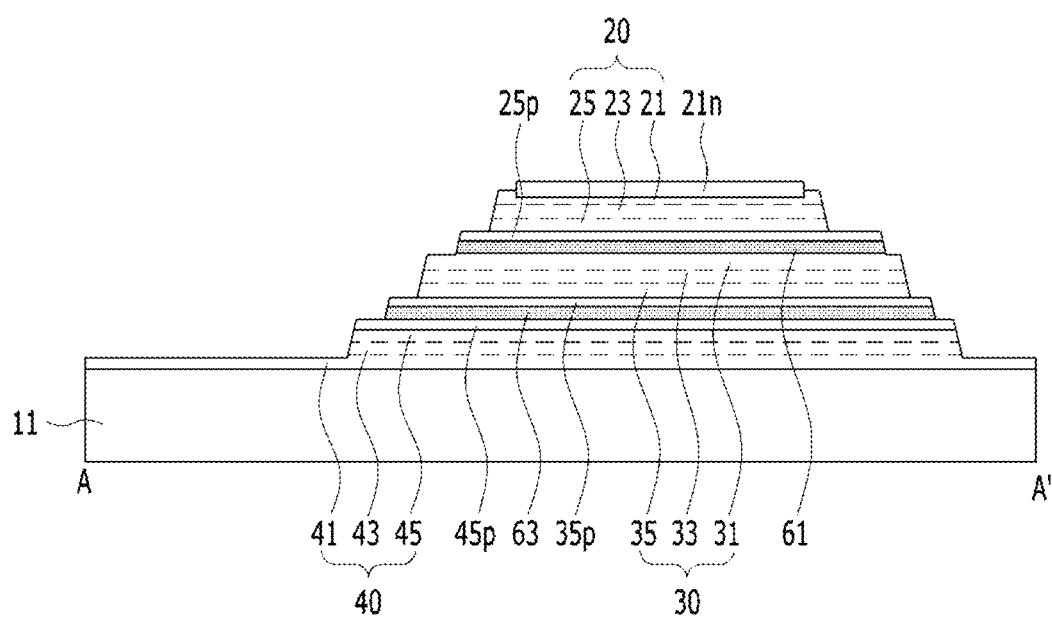

Referring to FIGS. 3A and 3B, various portions of each of the first, second, and third light emitting stacks 20, 30, and 40 may be patterned through an etching process or the like to expose portion of a first conductivity type semiconductor layer 21, a first lower contact electrode 25p, a first conductivity type semiconductor layer 31, a second lower contact electrode a third lower contact electrode 45p, and a first conductivity type semiconductor layer 41. According to the illustrated exemplary embodiment, the first light emitting stack 20 has the smallest area among the light emitting stacks 20, 30, and 40. The third light emitting stack 40 may have the largest area among the light emitting stacks 20, 30, and 40, and thus, luminous intensity of the third light emitting stack 40 may be relatively increased. However, the inventive concepts are not particularly limited to the relative sizes of the light emitting stacks 20, 30, and Referring to FIGS. 4A and 4B, a portion of an upper surface of the first conductivity type semiconductor layer 21 of the first light emitting stack 20 may be patterned through wet etching to form a first upper contact electrode 21n thereon. As described above, the first upper contact electrode 21n may be formed to have the thickness of about 100 nm in the patterned region of the first conductivity type semiconductor layer 21, for example, which may improve an ohmic contact therebetween.

Figure 5A:
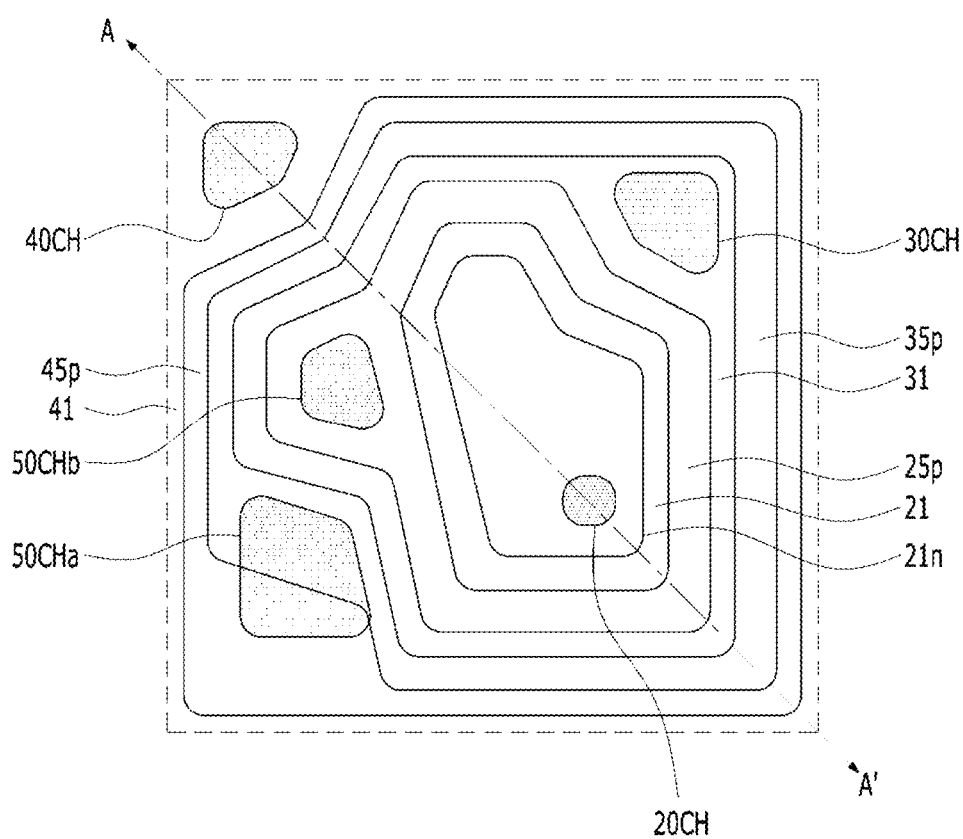
Figure 5B:
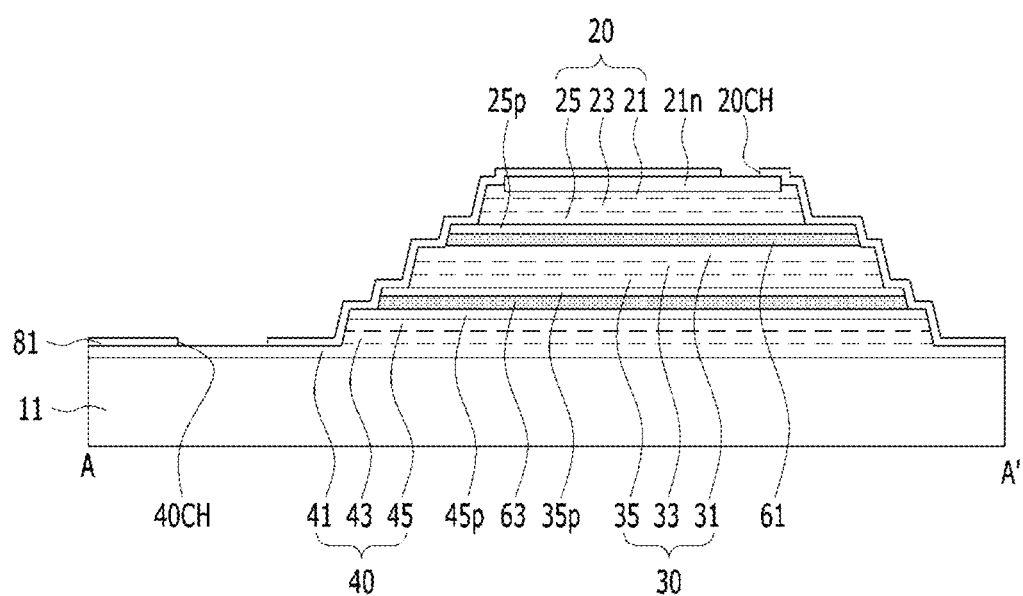

Referring to FIGS. 5A and 5B, a first insulation layer 81 may be formed to cover the light emitting stacks 20, 30, and 40, and a portion of the first insulation layer 81 may be removed to form first, second, third, and fourth contact holes 20CH, 30CH, 40CH, and 50CH. The first contact hole 20CH is defined on the first n-type contact electrode 21n to expose a portion of the first n-type contact electrode 21n.

The second contact hole 30CH may expose a portion of the first conductivity type semiconductor layer 31 of the second light emitting stack 30. The third contact hole 40CH may expose a portion of the first conductivity type semiconductor layer 41 of the third light emitting stack 40. The fourth contact hole 50CH may expose portions of the first, second, and third lower contact electrodes 21p, 31p, and 41p. The fourth contact hole 50CH may include a first sub-contact hole 50CHa exposing a portion of the first lower contact electrode 25p and a second sub-contact hole 50CHb exposing the second and third lower contact electrodes 35p and 45p. However, in some exemplary embodiments, a single first sub-contact hole CH may expose each of the first, second, and third lower contact electrodes 21p, 31p, and 41p.

Figure 6A:
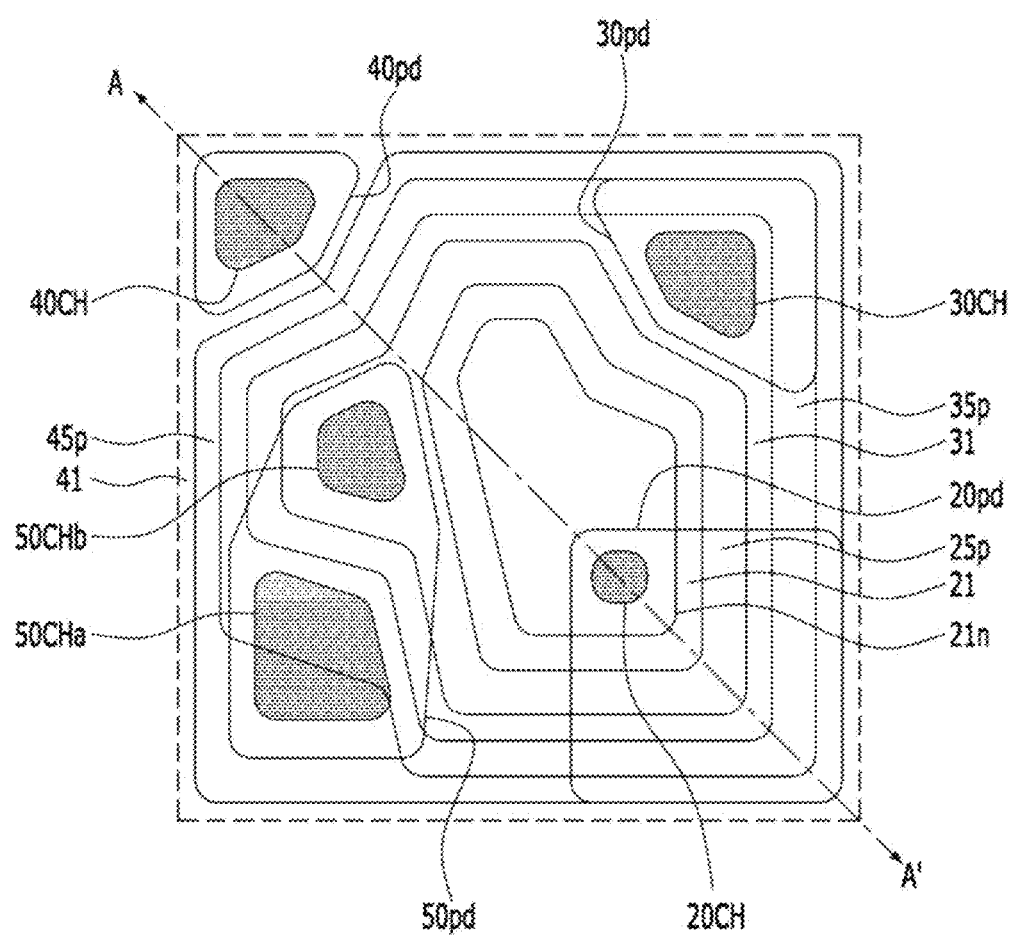
Figure 6B:
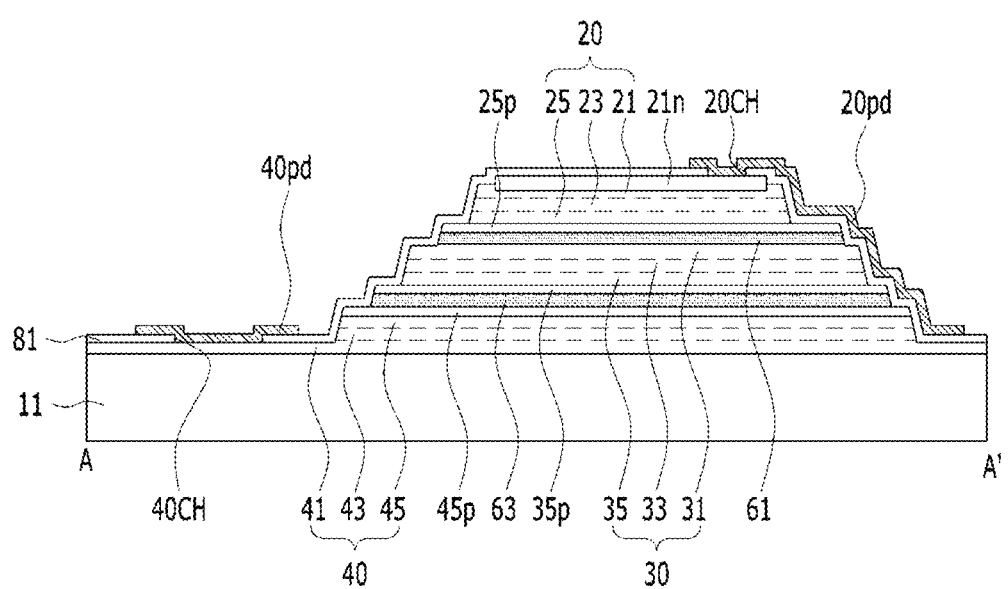

Referring to FIGS. 6A and 6B, first, second, third, and fourth pads 20pd, 30pd, 40pd, and 50pd are formed on the first insulation layer 81 which is formed with the first, second, third, and fourth contact holes 20CH, 30CH, 40CH, and 50CH. The first, second, third, and fourth pads 20pd, 30pd, 40pd, and 50pd may be formed, for example, by forming a conductive layer on a substantially entire surface of the substrate 11, and patterning the conductive layer using a photolithography process.

The first pad 20pd may be formed to be overlapped with a region where the first contact hole 20CH is formed, and the first pad 20pd may be connected to the first upper contact electrode 21n of the first light emitting stack 20 through the first contact hole 20CH. The second pad 30pd may be formed to be overlapped with a region where the second contact hole 30CH is formed, and the second pad 30pd may be connected to the first conductivity type semiconductor layer 31 of the second light emitting stack 30 through the second contact hole 30CH. The third pad 40pd may be formed to be overlapped with a region where the third contact hole 40CH is formed, and the third pad 40pd may be connected to the first conductivity type semiconductor layer 41 of the third light emitting stack 40 through the third contact hole 40CH. The fourth pad 50pd is formed to be overlapped with a region where the fourth contact hole 50CH is formed, particularly a region where the first and second sub-contact holes 50CHa and 50CHb are formed, and the fourth pad 50pd may be connected to the lower contact electrodes 25p, 35p, and 45p of the first, second, and third light emitting stacks 20, 30, and 40 through the first and second sub-contact holes 50CHa and 50CHb.

Figure 7A:
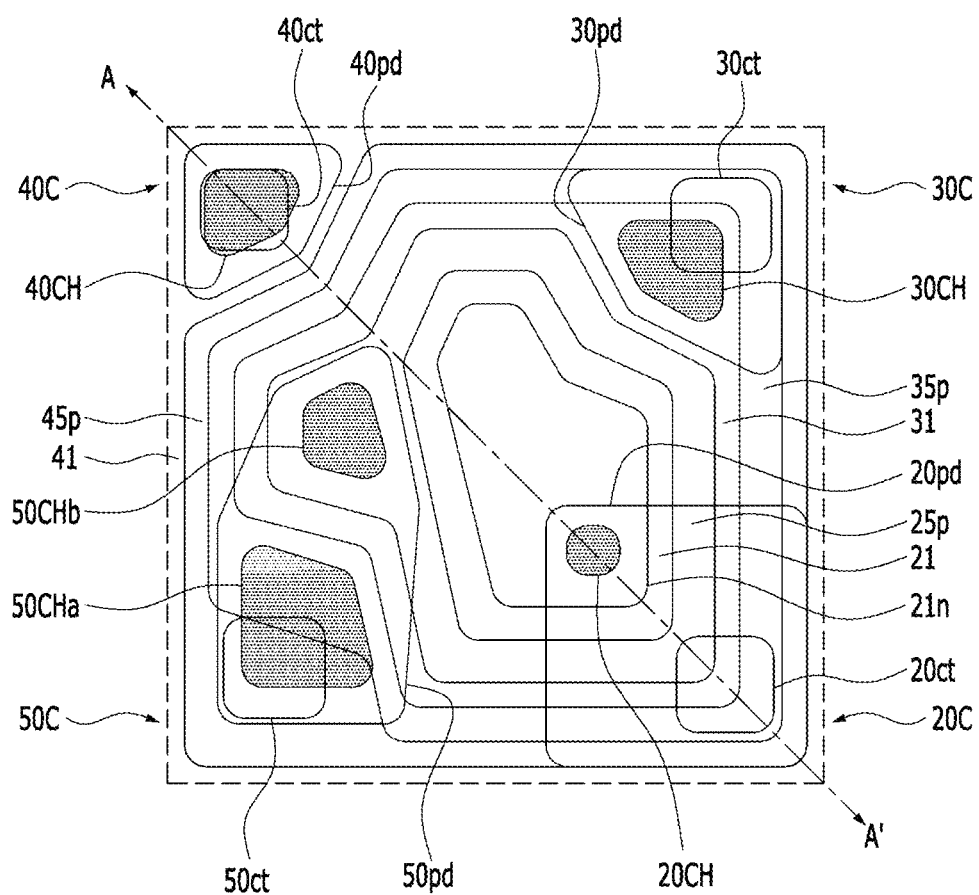
Figure 7B:
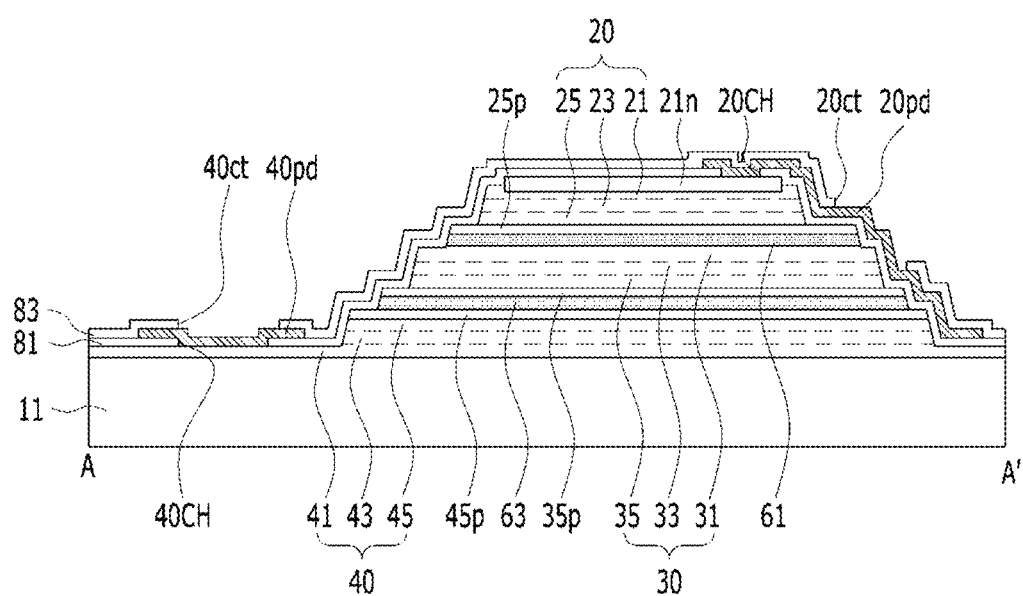

Referring to FIGS. 7A and 7B, a second insulation layer 83 may be formed on the first insulation layer 81. The second insulation layer 83 may include silicon oxide and/or silicon nitride. However, the inventive concepts are not limited thereto, and, in some exemplary embodiments, the first and second insulation layers 81 and 83 may include inorganic materials. Subsequently, the second insulation layer 83 may be patterned to form first, second, third, and fourth through holes 20ct, 30ct, 40ct, and 50ct therein.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be defined within regions where the first, second, third, and fourth pads 20pd, 30pd, 40pd, and 50pd are formed, respectively.

Figure 8A:
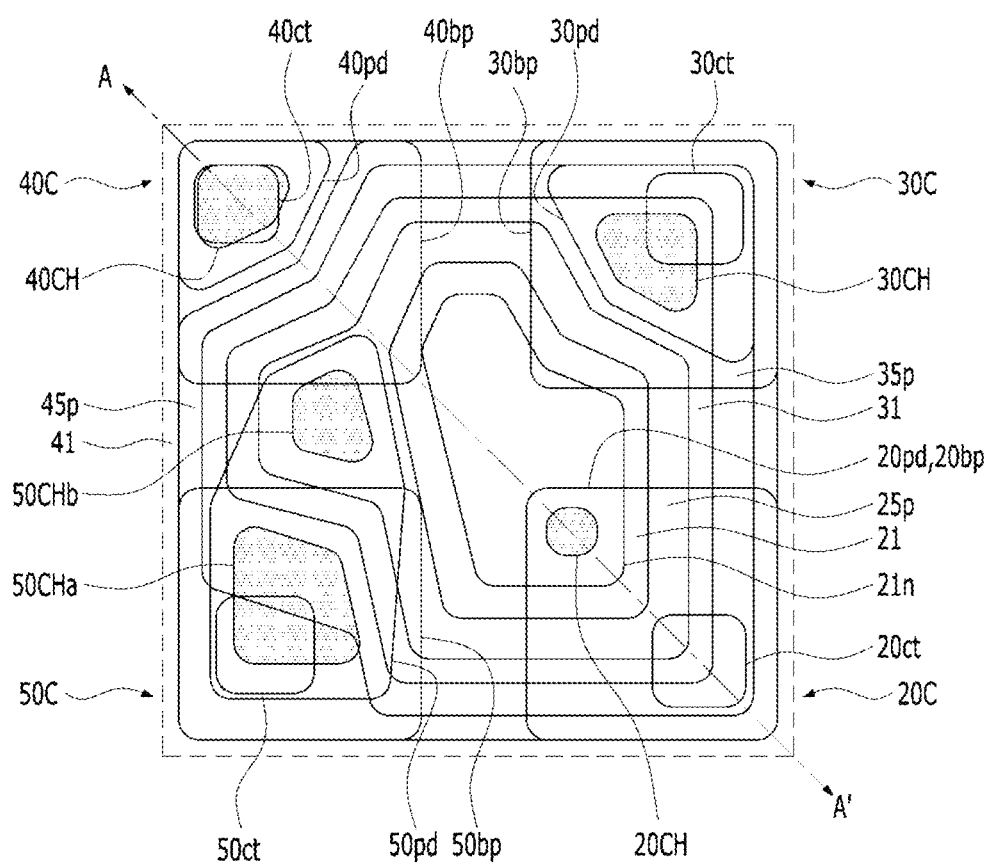
Figure 8B:
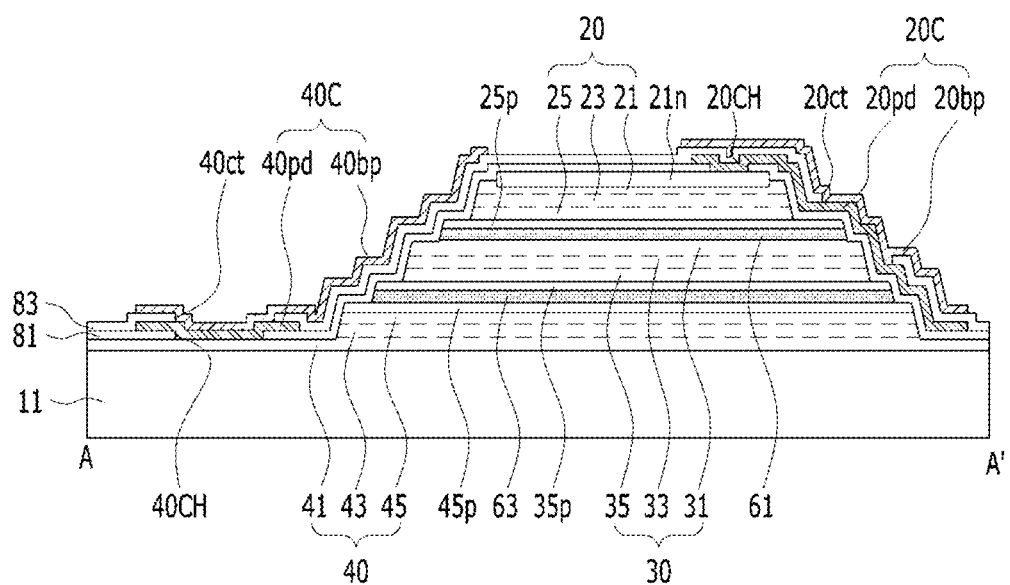
Figure 9:
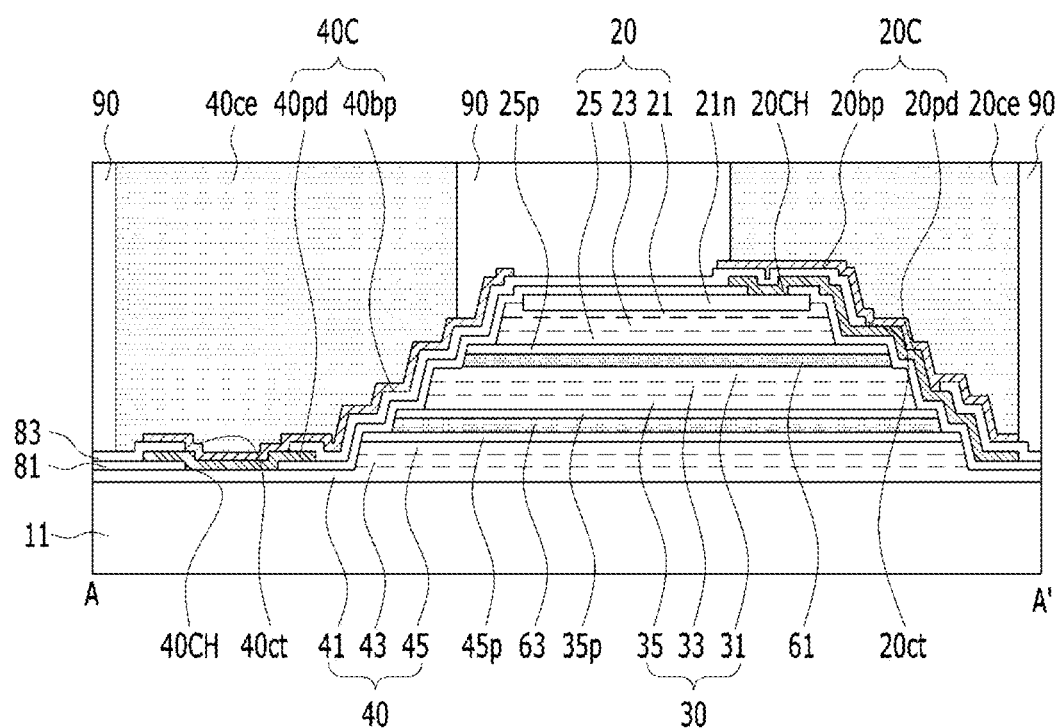
FIG. 9 is a schematic cross-sectional view of the light emitting device of FIG. 1A according to an exemplary embodiment.

Referring to FIGS. 8A and 8B, first, second, third and fourth bump electrodes 20bp, 40bp, and 50bp are formed on the second insulation layer 83 on which the first, second, third and fourth through holes 20ct, 30ct, 40ct, and 50ct are formed. The first bump electrode 20bp may be formed to be overlapped with a region where the first through hole 20ct is formed, and the first bump electrode 20bp may be connected to the first pad 20pd through the first through hole 20ct. The second bump electrode 30bp may be formed to be overlapped with a region where the second through hole 30ct is formed, and the second bump electrode 30bp may be connected to the second pad 30pd through the second through hole 30ct. The third bump electrode 40bp may be formed to be overlapped with a region where the third through hole 40ct is formed, and the third bump electrode 40bp may be connected to the third pad 40bp through the third through hole 40ct. The fourth bump electrode 50bp may be formed to be overlapped with a region where the fourth through hole 50ct is formed, and the fourth bump electrode 50bp may be connected to the fourth pad 50pd through the fourth through hole 50ct. The first, second, third, and fourth bump electrodes 20bp, 30bp, 40bp, and 50bp may be formed by depositing a conductive layer on the substrate 11 and patterning the conductive layer. The conductive layer may include at least one of, for example, Ni Ag, Au, Pt, Ti, Al, Cr, Wi, TiW, Mo, Cu, TiCu, and the like.

Referring back to FIGS. 1B through 1D, the first, second, third, and fourth connection electrodes 20ce, 30ce, 40ce, and 50ce spaced apart from one another are formed on the light emitting stacked structure. The first, second, third, and fourth connection electrodes 30ce, 40ce, and 50ce are electrically connected to the first, second, third, and fourth bump electrodes 20bp, 30bp, 40bp, and 50bp, respectively, thereby providing a path for a transmission of an external signal to each of the light emitting stacks 20, 30, and 40. More specifically, according to the illustrated exemplary embodiment, the first connection electrode 20ce is connected to the first bump electrode 20bp connected to the first upper contact electrode 21n through the first pad 20pd, so that the first connection electrode 20ce may be electrically connected to the first conductivity type semiconductor layer 21 of the first light emitting stack 20. The second connection electrode 30ce is connected to the second bump electrode 30bp connected to the second pad 30pd, so that the second connection electrode 30ce may be electrically connected to the first conductivity type semiconductor layer 31 of the second light emitting stack 30. The third connection electrode 40ce is connected to the third bump electrode connected to the third pad 40pd, so that the third connection electrode 40ce may be electrically connected to the first conductivity type semiconductor layer 41 of the third light emitting stack 40. The fourth connection electrode 50ce is connected to the fourth bump electrode 50bp connected to the fourth pad 50*pd*, so that the fourth connection electrode 50*ce* may be electrically connected to the second conductivity type semiconductor layers 25, 35, and of the light emitting stacks 20, 30, and 40 through the first, second and third lower contact electrodes 25*p*, 35*p*, and 45*p*, respectively.

The method of forming the first, second, third, and fourth connection electrodes 30*ce*, 40*ce*, and 50*ce* is not particularly limited. For example, according to an exemplary embodiment, a seed layer may be deposited as a conductive surface on the light emitting stacked structure, and the seed layer may be patterned using photolithography or the like, such that the seed layer is disposed at a desired location where the connection electrode is to be formed. According to an exemplary embodiment, the seed layer may be deposited to have a thickness of about 1000 Å, but the inventive concepts are not limited thereto. Subsequently, the seed layer may be plated with metal, such as Cu, Ni, Ti, Sb, Zn, Mo, Co, Sn, Ag or an alloy thereof, and the photoresist pattern and the seed layer may be removed. In some exemplary embodiments, to prevent or at least inhibit oxidation of the plated metal, an additional metal may be deposited or plated with electroless nickel immersion gold (ENIG) or the like on the plated metal (for example, connection electrodes). In some exemplary embodiments, the seed layer may be retained on each of the connection electrodes.

According to an exemplary embodiment, when the bump electrodes 20*bp*, 30*bp*, 40*bp*, and 50*bp* are omitted from contacts 20C, 30C, 40C, and 50C, the pads 20*pd*, 30*pd*, 40*pd*, and 50*pd* may be connected to the respective connection electrodes 20*ce*, 30*ce*, 40*ce*, and 50*ce*. For example, after the through holes 20*ct*, 30*ct*, 40*ct*, and 50*ct* are formed to partially expose the pads 20*pd*, 30*pd*, 40*pd*, and 50*pd* of the contacts 20C, 30C, 40C, and 50C, the seed layer may be deposited on the light emitting stacked structure as a conductive surface, and the seed layer may be patterned using photolithography or the like so that the seed layer is disposed at a desired location where the connection electrode is to be formed. In this case, the seed layer may be overlapped with at least a portion of each of the pad 20*pd*, 30*pd*, 40*pd*, and 50*pd*. According to an exemplary embodiment, the seed layer may be deposited to have a thickness of about 1000 Å, but the inventive concepts are not limited thereto. Thereafter, the seed layer may be plated with metal, such as Cu, Ni, Ti, Sb, Zn, Mo, Co, or the like, and the seed layer may be removed. In some exemplary embodiments, to prevent or at least inhibit oxidation of the plated metal, an additional metal may be deposited or plated with ENIG or the like on the plated metal (for example, connection electrodes). In some exemplary embodiments, the seed layer may be retained on each of the connection electrodes.

According to the illustrated exemplary embodiment, each of the connection electrodes 20*ce*, 30*ce*, 40*ce*, and 50*ce* may have a substantially elongated shape to be spaced apart from the substrate 11. In another exemplary embodiment, the connection electrodes 20*ce*, 30*ce* and 40*ce* may include two or more metals or a plurality of different metal layers to reduce stress from the elongated shape of the connection electrodes 20*ce*, 30*ce*, 40*ce*, and 50*ce*. However, the inventive concepts are not limited to a specific shape of the connection electrodes 20*ce*, 30*ce*, 40*ce*, and 50*ce*, and, in some exemplary embodiments, the connection electrode may have various shapes.

As shown in the drawings, each of the connection electrodes 20*ce*, 30*ce*, 40*ce*, and 50*ce* may have a substantially flat upper surface to facilitate electrical connection between the light emitting stacked structure and outer lines or electrodes. The connection electrodes 20*ce*, 30*ce*, 40*ce*, and 50*ce* may be overlapped with at least one step formed on the side surface of the light emitting stacked structure. In this manner, a lower surface of the connection electrode may provide a larger contact area than that of an upper surface thereof, thereby providing a larger contact area between the connection electrodes 20*ce*, 30*ce*, 40*ce* and 50*ce* and the light emitting stacked structure. In this manner, the light emitting device 100 along with a protection layer 90 may have a more stable structure that is capable of withstanding various subsequent processes. In this case, a length L of one side surface of the connection electrodes 20*ce*, 30*ce*, 40*ce*, and 50*ce* that faces to the outside and a length L' of another surface that faces a center of the light emitting device 100 may be different. For example, a difference in lengths between two surfaces of the connection electrode opposite to each other may be about 3 μm to about 16 μm, but the inventive concepts are not limited thereto.

Then, the protection layer 90 is disposed between the connection electrodes 20*ce*, 30*ce*, 40*ce*, and 50*ce*. The protection layer 90 may be formed to be substantially flush with the upper surfaces of the connection electrodes 20*ce*, 30*ce*, 40*ce*, and 50*ce* by a polishing process or the like. According to an exemplary embodiment, the protection layer 90 may include a black epoxy molding compound (EMC), but the inventive concepts are not limited thereto. For example, in some exemplary embodiments, the protection layer 90 may include a photosensitive polyimide dry film (PID). In this manner, the protection layer 90 may provide a sufficient contact area to the light emitting device 100 not only to protect the light emitting structure from external impacts that may be applied during subsequent processes, but also to facilitate handling during a subsequent transferring step. In addition, the protection layer 90 may prevent light leakage from the side surface of the light emitting device 100 to prevent or at least to suppress interference of light emitted from adjacent light emitting devices 100.

Figure 10:
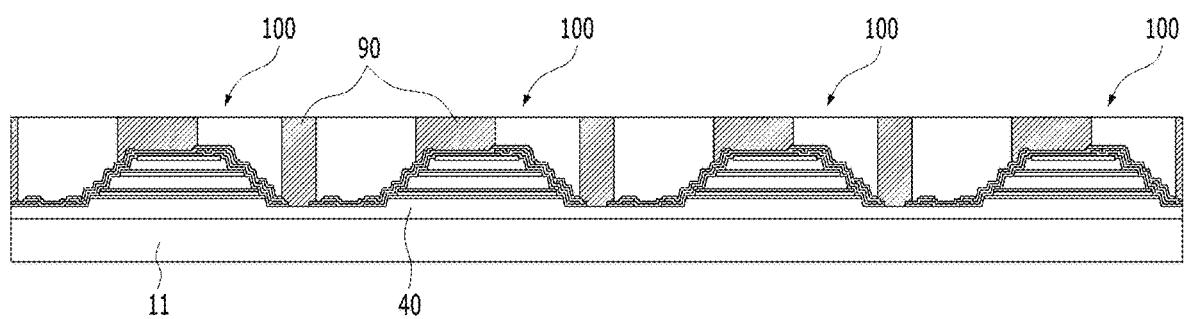
FIGS. 10, 11, 12, and 13 are cross-sectional views schematically illustrating a process of manufacturing the light emitting device of FIG. 1A according to an exemplary embodiment.
Figure 11:
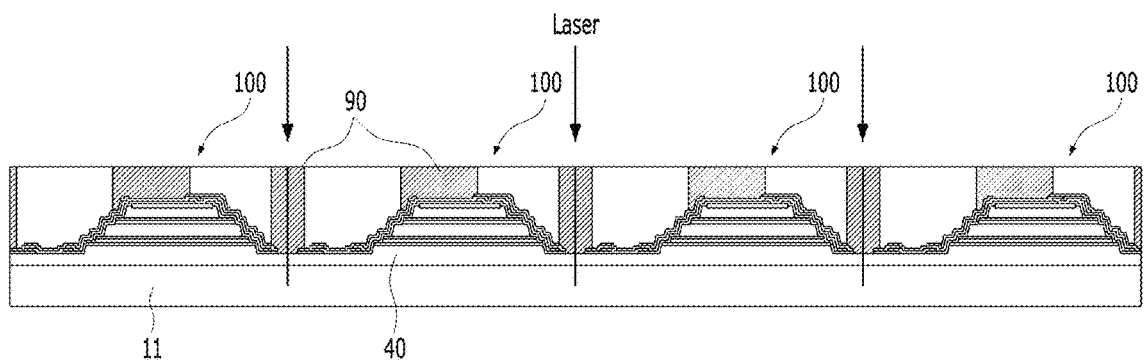
Figure 12:
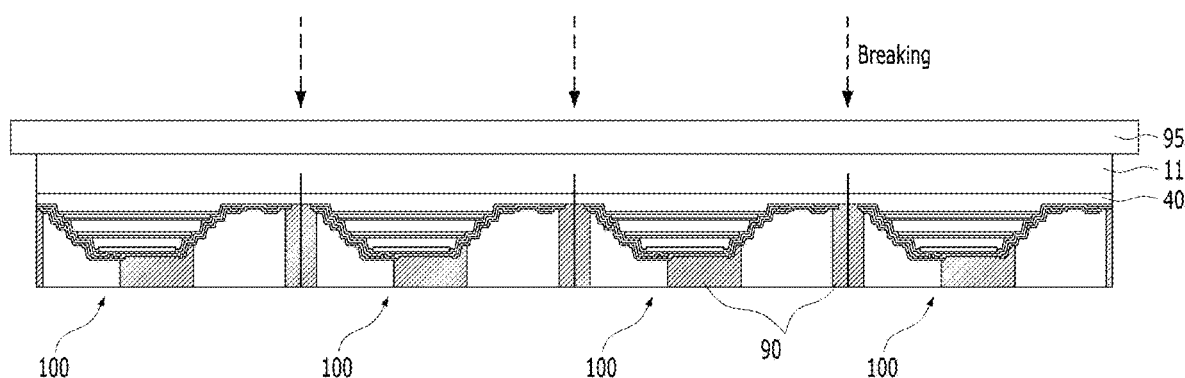
Figure 13:
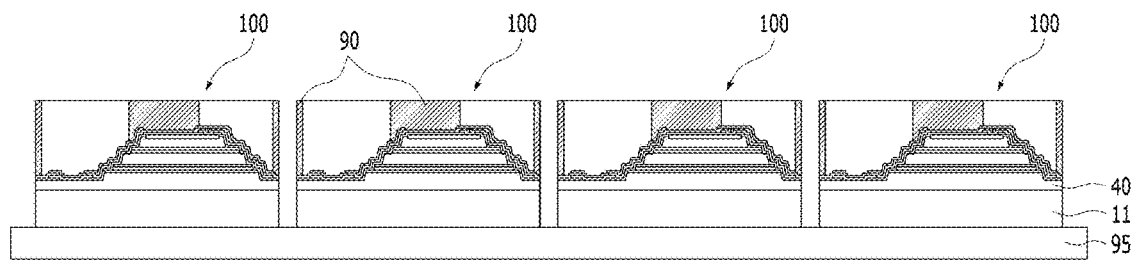

FIG. 10 exemplarily shows a plurality of light emitting devices 100 disposed on the substrate 11, and a singularizing process is applied to separate each of the light emitting devices 100. Referring to FIG. 11, according to an exemplary embodiment, laser beams may be irradiated between the light emitting stacked structures to form a separation path that partially separates the light emitting stacked structures. Referring to FIG. 12, a first bonding layer 95 is attached to the substrate 11, and the substrate 11 with the first bonding layer 95 attached thereon may be cut or broken using various methods that are well known in the art to unify each of the light emitting devices 100. For example, the substrate 11 may be cut by dicing the substrate 11 through a scribing line formed thereon, or the substrate 11 may be broken by applying a mechanical force along the separation path formed during a laser radiation process. The first bonding layer 95 may be a tape, but the inventive concepts are not limited thereto, as long as the first bonding layer 95 may stably attach the light emitting device 100 while separating the light emitting devices 100 in a subsequent process. Although the first bonding layer 95 has been described above as being attached on the substrate 11 after the laser radiation step, in some exemplary embodiments, the first bonding layer 95 may be attached on the substrate 11 before the laser radiation step.

FIGS. 14, 15, 16, and 17 are cross-sectional views schematically illustrating a process of manufacturing a light emitting package according to an exemplary embodiment. The light emitting device 100 according to an exemplary embodiment may be transferred and packaged in various ways known in the art. Hereinafter, a second adhesive layer 13 will be exemplarily illustrated as being attached to the substrate 11 using a carrier substrate 11c to transfer the light emitting device 100. However, the inventive concepts are not limited to a specific transfer method.

Figure 14:
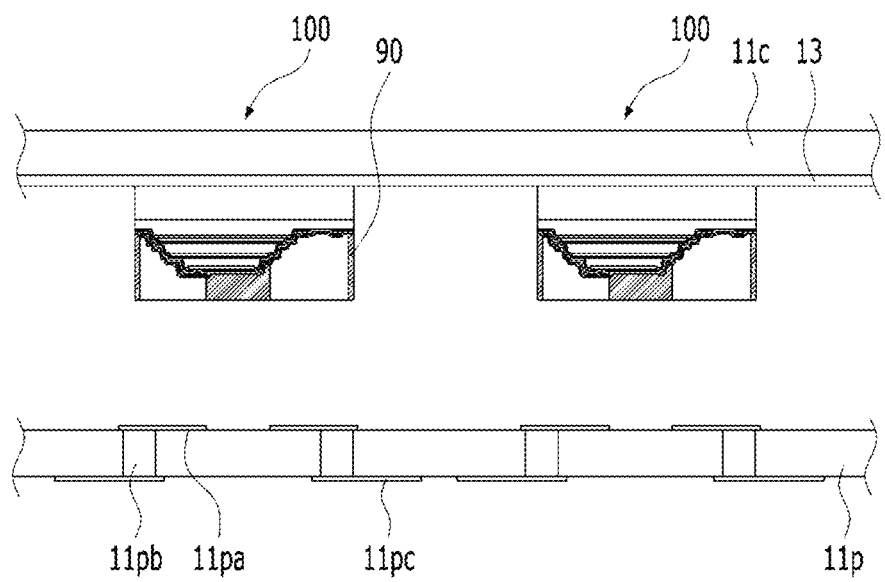
FIGS. 14, 15, 16A, and 17 are cross-sectional views schematically illustrating a process of manufacturing a light emitting package according to an exemplary embodiment.

Referring to FIG. 14, according to an exemplary embodiment, the singularized light emitting device 100 may be transferred to the carrier substrate 11c with the second adhesive layer 13 interposed therebetween. In this case, when the light emitting device 100 includes connection electrodes protruding outwardly from the light emitting stacked structure, various problems may occur in subsequent processes, particularly in a transfer process, due to their non-uniformed structure as described above. In addition, when the light emitting device 100 includes micro-LEDs having a surface area of about 10,000 μm$^2$ or less, of about 4,000 μm$^2$ or less, or about 2,500 μm$^2$ or less, depending on the application, handling of the light emitting device may be more difficult due to its small form factor. However, according to an exemplary embodiment, since the light emitting device 100 is provided with the protection layer 90 disposed between the connection electrodes 20ce, 30ce, 40ce, and 50ce, handling of the light emitting device 100 may be facilitated during subsequent processes, such as transfer and packaging. In addition, the light emitting structure may be protected from external impact, and interference of light between adjacent light emitting devices 100 may be prevented by the protection layer 90.

The carrier substrate 11c is not particularly limited as long as the carrier substrate 11c stably mounts the light emitting device 100 thereon with the second adhesive layer 13. The second adhesive layer 13 may be a tape, but the inventive concepts are not limited thereto, as long as the second adhesive layer 13 stably attaches the light emitting device 100 to the carrier substrate 11c, and the light emitting device 100 is capable of being separated during subsequent processes. In some exemplary embodiments, the light emitting device 100 of FIG. 13 may not be transferred to the separate carrier substrate 11c, but may be directly transferred to a circuit board 11p. In this case, the carrier substrate 11c illustrated in FIG. 14 may be the substrate 11, and the second adhesive layer 13 illustrated in FIG. 14 may be the first bonding layer illustrated in FIG. 13.

The light emitting device 100 may be mounted on the circuit board 11p.

According to an exemplary embodiment, the circuit board 11p may include an upper circuit electrode 11pa, a lower circuit electrode 11pc, and an intermediate circuit electrode 11pb that are electrically connected to one another. The upper circuit electrodes 11pa may correspond to each of the first, second, third, and fourth connection electrodes 20ce, 30ce, 40ce, and 50ce, respectively. In some exemplary embodiments, the upper circuit electrodes 11pa may be surface-treated by ENIG, and be partially melt at a high temperature, thereby facilitating electrical connection to the connection electrodes of the light emitting device 100.

According to the illustrated exemplary embodiment, the light emitting devices 100 may be spaced apart from one another on the carrier substrate 11c at a desired pitch in consideration of a pitch P (see FIG. 16B) of the upper circuit electrode of the circuit board 11p, which will be mounted on a final target device such as a display apparatus.

According to an exemplary embodiment, the first, second, third, and fourth connection electrodes 20ce, 30ce, 40ce, and 50ce of the light emitting device 100 may be bonded to the upper circuit electrodes 11pa of the circuit board 11p, respectively, by anisotropic conductive film (ACF) bonding, for example. When the light emitting device 100 is bonded to the circuit board 11p through ACF bonding, which may be performed at a lower temperature than other bonding methods, the light emitting device 100 may be prevented from being exposed to a high temperature while bonding. However, the inventive concepts are not limited to a specific bonding method. For example, in some exemplary embodiments, the light emitting devices 100 may be bonded to the circuit board 11p using anisotropic conductive paste (ACP), solder, a ball grid array (BGA), or a micro bump including at least one of Cu and Sn. In this case, since the upper surfaces of the connection electrodes 20ce, 30ce, 40ce, and 50ce and the protection layer 90 are substantially flush with one another by a polishing process or the like, adhesion of the light emitting device 100 to the anisotropic conductive film increases, and thus a more stable structure may be formed when bonded to the circuit board 11p.

Figure 15:
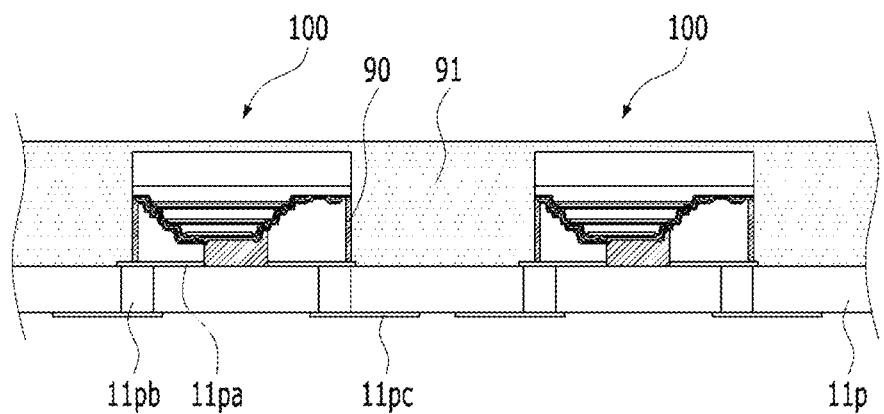

Referring to FIG. 15, a molding layer 91 is formed between the light emitting devices 100. According to an exemplary embodiment, the molding layer 91 may transmit a portion of light emitted from the light emitting device 100, and may reflect, diffract, and/or absorb a portion of external light so as to prevent external light from being reflected by the light emitting device 100 in a direction visible to the user. The molding layer 91 may cover at least a portion of the light emitting device 100 to protect the light emitting device from moisture and stress. In addition, the molding layer 91, along with the protection layer 90 formed on the light emitting device 100, may enhance the structure thereof to provide additional protection to the light emitting package.

According to an exemplary embodiment, when the molding layer 91 covers an upper surface of the substrate 11 facing the circuit board 11p, the molding layer 91 may have a thickness of less than about 100 μm to transmit at least 50% of light. In an exemplary embodiment, the molding layer 91 may include an organic or inorganic polymer. In some exemplary embodiments, the molding layer 91 may further include fillers such as silica or alumina. In some exemplary embodiments, the molding layer 91 may include substantially the same material as the protection layer 90. The molding layer 91 may be formed through various methods known in the art, such as lamination, plating and/or printing methods. For example, the molding layer 91 may be formed by a vacuum lamination process, in which an organic polymer sheet is disposed on the light emitting device 100 and subjected to a high temperature and a high pressure in vacuum, and thus, a substantially flat upper surface of the light emitting package may be provided, thereby improving uniformity of light.

In some exemplary embodiments, the substrate 11 may be removed from the light emitting device 100 before the molding layer 91 is formed. When the substrate 11 is a patterned sapphire substrate, an irregularity portion may be formed on the first conductivity type semiconductor layer 41 of the third light emitting stack 40 that is in contact with the substrate 11, thereby improving luminous efficiency. In another exemplary embodiment, irregularities may be formed on the first conductivity type semiconductor layer 41 of the third light emitting stack 40 by etching or patterning after the first conductivity type semiconductor layer 41 of the third light emitting stack 40 is separated from the substrate 11.

Figure 16A:
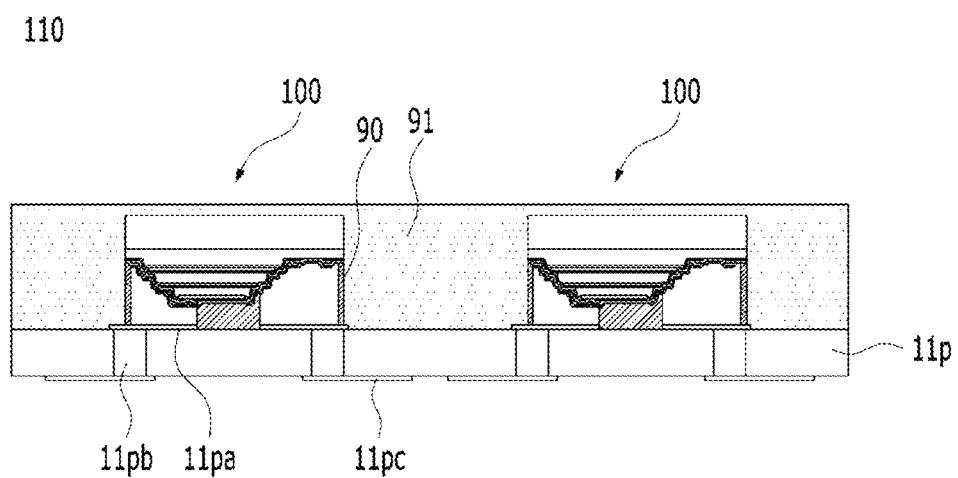
Figure 16B:
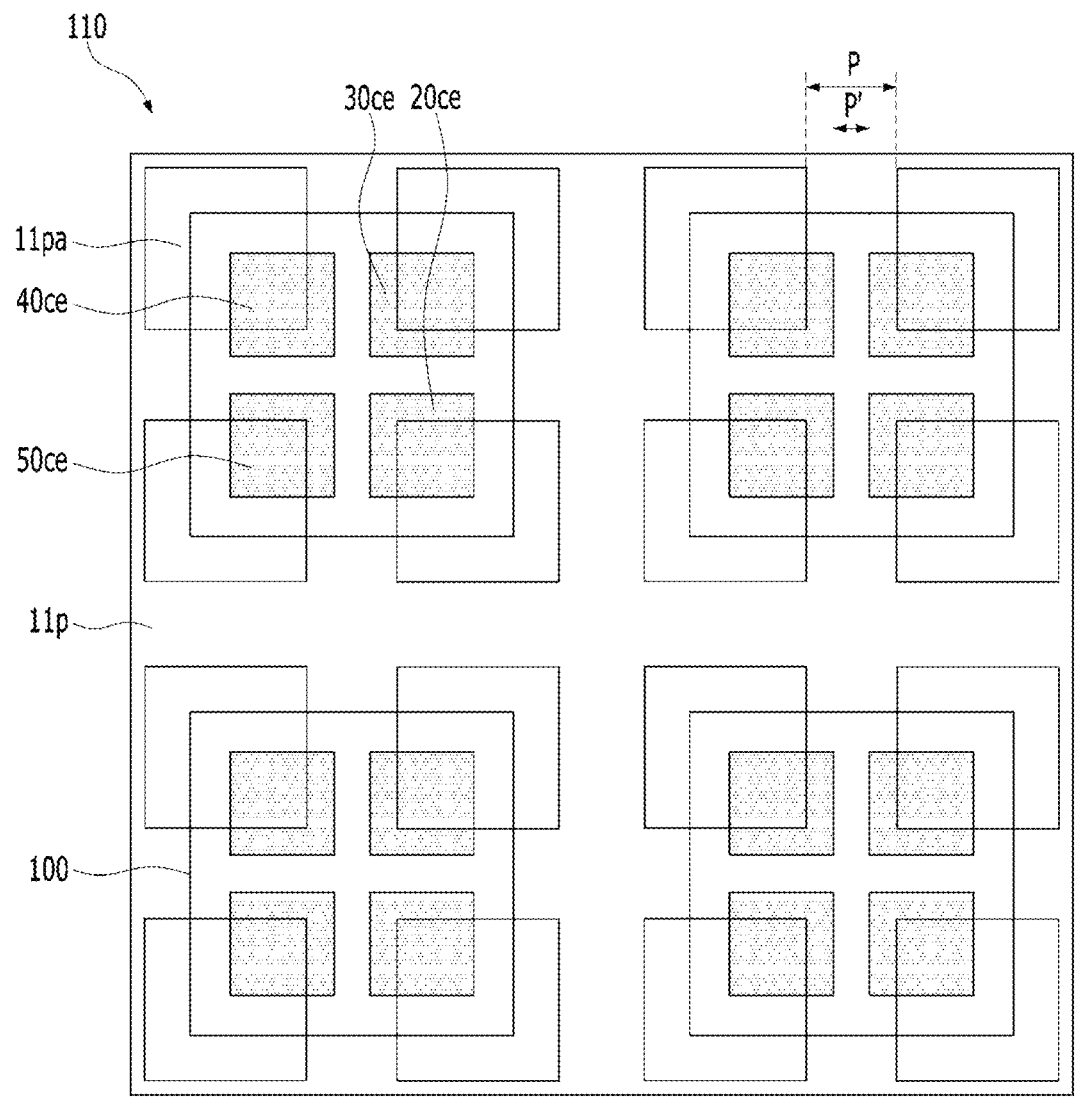
FIG. 16B is schematic plan view of the light emitting device of FIG. 16A.

Referring to FIGS. 16A and 16B, the light emitting device 100 disposed on the circuit board 11p may be cut into a desired configuration and formed as a light emitting package 110. FIG. 16B exemplarily illustrates four light emitting devices 100 (2×2) disposed on the circuit board 11p. However, the inventive concepts are not limited to a specific number of light emitting devices formed in the light emitting package 110. For example, in some exemplary embodiments, the light emitting package 110 may include one or more light emitting devices 100 formed on the circuit board 11p. In addition, the inventive concepts are not limited to a specific arrangement of one or more light emitting devices 100 in the light emitting package 110. For example, in some exemplary embodiments, one or more light emitting devices 100 may be arranged in the light emitting package 110 in an n×m-arrangement, in which n and m are natural numbers. According to an exemplary embodiment, the circuit board 11p may include a scan line and a data line to independently drive each of the light emitting devices 100 included in the light emitting package 110.

Figure 17:
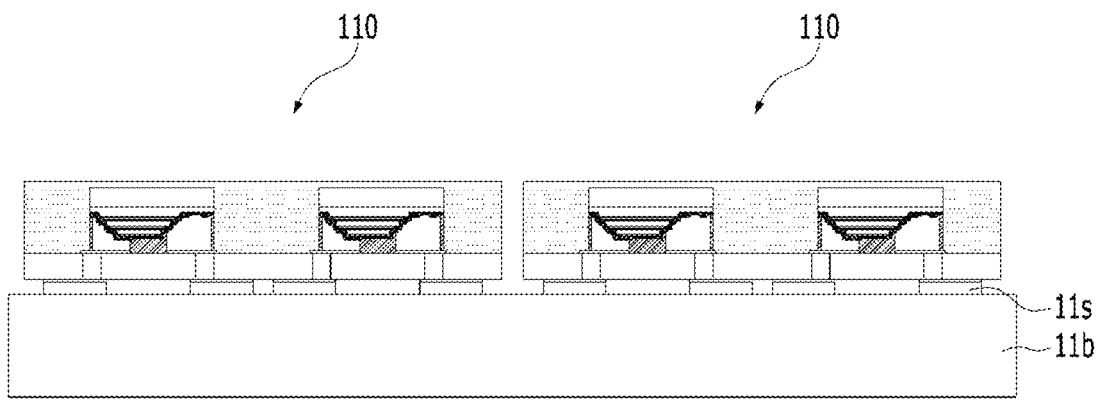

Referring to FIG. 17, a light emitting package 110 may be mounted on a target substrate 11b of a final apparatus, such as a display apparatus. The target substrate 11b may include target electrodes 11s that correspond to lower circuit electrodes 11pc of the light emitting package 110, respectively. The display apparatus according to an exemplary embodiment may include a plurality of pixels, and each of the light emitting devices 100 may be disposed corresponding to each of the pixels. More specifically, each light emitting stack of the light emitting devices 100 according to an exemplary embodiment may correspond to each sub-pixel of one pixel. Since the light emitting devices 100 include the light emitting stacks 20, 30, and 40 that are vertically stacked, the number of devices to be transferred for each sub-pixel may be substantially reduced than that of conventional light emitting devices. In addition, since surfaces of connection electrodes opposite to each other have different lengths from each other, the connection electrode may be stably formed in the light emitting stacked structure to enhance an internal structure thereof. In addition, since the light emitting devices 100 may include a protection layer 90 between the connection electrodes, the light emitting devices 100 may be protected from an external impact.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting apparatus, comprising:
   a circuit board including upper electrodes;
   a first light emitter disposed on the circuit board; and
   connection electrodes connecting the upper electrodes and the first light emitter,
   wherein the first light emitter includes a light source including semiconductor layers,
   one of the connection electrodes includes a first outer surface and a second outer surface disposed opposite to the first outer surface, and
   a difference between a length of the first outer surface and a length of the second outer surface in cross section is greater than a thickness of the semiconductor layers.

2. The light emitting apparatus of claim 1, the semiconductor layers include a first type semiconductor layer, a second type semiconductor layer, and an active layer disposed between the first type semiconductor layer and the second type semiconductor layer.

3. The light emitting apparatus of claim 1, wherein the light source further includes a superlattice layer and a transparent conductive material.

4. The light emitting apparatus of claim 1, further comprising:
   a first insulation layer disposed between the circuit board and the light source,
   wherein the first insulation layer includes a multiple-layer structure of two or more insulation layers having different refractive indices.

5. The light emitting apparatus of claim 2, further comprising:
   a molding layer covering at least a portion of the first light emitter,
   wherein the molding layer is configured to transmit a light emitted from the active layer.

6. The light emitting apparatus of claim 1, wherein a thickness of the semiconductor layers is greater than 4 um.

7. The light emitting apparatus of claim 1, further comprising:
   a second light emitter disposed on the circuit board,
   wherein the second light emitter is spaced apart from the first light emitter.

8. A light emitting apparatus, comprising:
   a circuit board including upper electrodes;
   a first light emitter disposed on the circuit board; and
   connection electrodes connecting the upper electrodes and the first light emitter,
   wherein the first light emitter includes a light source including semiconductor layers,
   one of the connection electrodes includes a first outer surface and a second outer surface disposed opposite to the first outer surface, and
   a difference between a length of the first outer surface and a length of the second outer surface in cross section is greater than 3 um.

9. The light emitting apparatus of claim 8, wherein the semiconductor layers include a first type semiconductor layer, a second type semiconductor layer, and an active layer disposed between the first type semiconductor layer and the second type semiconductor layer.

10. The light emitting apparatus of claim 8, wherein the light source further includes a superlattice layer and a transparent conductive material.

11. The light emitting apparatus of claim 8, further comprising:
    a first insulation layer disposed between the circuit board and the light source,
    wherein the first insulation layer includes a multiple-layer structure of two or more insulation layers having different refractive indices.

12. The light emitting apparatus of claim 9, further comprising:
    a molding layer covering at least a portion of the first light emitter,
    wherein the molding layer is configure to transmit a light emitted from the active layer.

13. The light emitting apparatus of claim 8, wherein a thickness of the semiconductor layers is greater than 4 um.

14. The light emitting apparatus of claim 8, further comprising:
    a second light emitter disposed on the circuit board,
    wherein the second light emitter is spaced apart from the first light emitter.

15. A light emitting apparatus, comprising:
    a circuit board including upper electrodes;
    a first light emitter disposed on the circuit board; and connection electrodes connecting the upper electrodes and the first light emitter, wherein the first light emitter includes a light source including semiconductor layers, one of the connection electrodes includes a first outer surface and a second outer surface disposed opposite to the first outer surface, and a thickness of the semiconductor layers is less than a difference between a length of the first outer surface and a length of the second outer surface in cross section.

16. The light emitting apparatus of claim 15, wherein the semiconductor layers include a first type semiconductor layer, a second type semiconductor layer, and an active layer disposed between the first type semiconductor layer and the second type semiconductor layer.

17. The light emitting apparatus of claim 15, wherein the light source further includes a superlattice layer and a transparent conductive material.

18. The light emitting apparatus of claim 15, further comprising:

a first insulation layer disposed between the circuit board and the light source, wherein the first insulation layer includes a multiple-layer structure of two or more insulation layers having different refractive indices.

19. The light emitting apparatus of claim 16, further comprising:

a molding layer covering at least a portion of the first light emitter, wherein the molding layer is configured to transmit a light emitted from the active layer.

20. The light emitting apparatus of claim 15, further comprising:

a second light emitter disposed on the circuit board, wherein the second light emitter is spaced apart from the first light emitter.

* * * * *